United States Patent
Zolotykh et al.

(10) Patent No.: US 6,564,361 B1
(45) Date of Patent: May 13, 2003

(54) METHOD AND APPARATUS FOR TIMING DRIVEN RESYNTHESIS

(75) Inventors: Andrej A. Zolotykh, Moskovskaya Oblast (RU); Elyar E. Gasanov, Moscow (RU); Alexander S. Podkolzin, Moscow (RU); Valery B. Kudryavtsev, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 227 days.

(21) Appl. No.: 09/677,475

(22) Filed: Oct. 2, 2000

(51) Int. Cl.⁷ ................................. G06F 17/50
(52) U.S. Cl. ............... 716/8; 716/2; 716/3; 716/10; 714/724
(58) Field of Search ............... 716/1–21; 257/206; 326/93; 327/295; 714/724

(56) References Cited

U.S. PATENT DOCUMENTS 6,026,223 A * 2/2000 Scepanovic et al. .......... 716/10
6,301,693 B1 * 10/2001 Naylor et al. .................. 716/10
6,453,446 B1 * 9/2002 van Ginneken ................ 716/2

* cited by examiner

Primary Examiner—Vuthe Siek
Assistant Examiner—Helen B Rossoshek
(74) Attorney, Agent, or Firm—Mitchell, Silberberg & Knupp LLP

(57) ABSTRACT

The present invention comprises method for optimizing an integrated circuit design that includes computing of capacities and delays of an integrated circuit design, resynthesizing said integrated circuit design utilizing a plurality of local optimization procedures, and removing overlap the local optimization procedures can include a local resynthesis of logic trees procedure that utilizes multiple cost functions, a dynamic buffer and inverter tree optimization procedure, and a cell resizing procedure. Generally, faster local optimization procedures are applied first and slower, more thorough procedures are applied to areas where the faster procedures have not solved the optimization tasks.

4 Claims, 11 Drawing Sheets

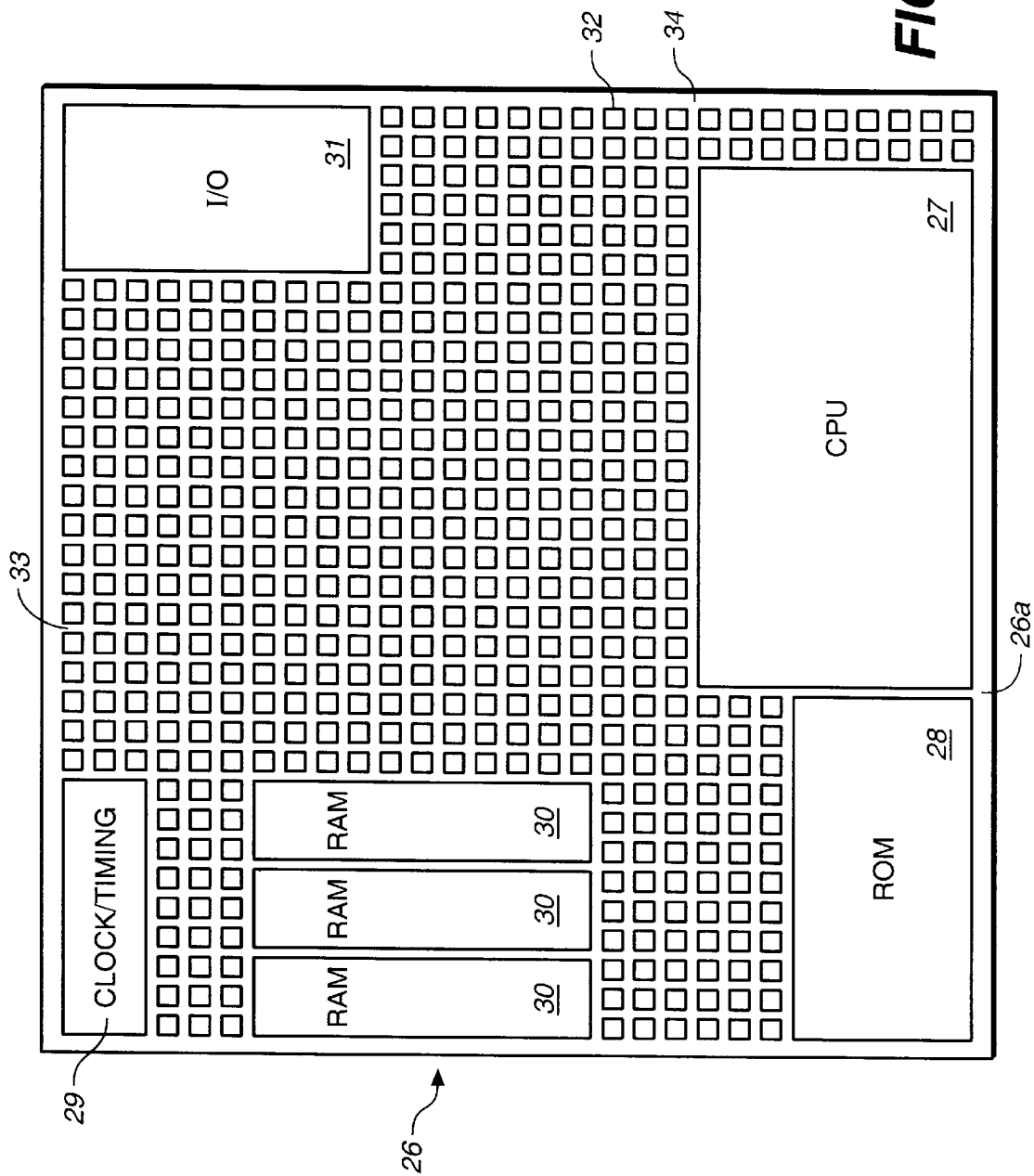
FIG._1

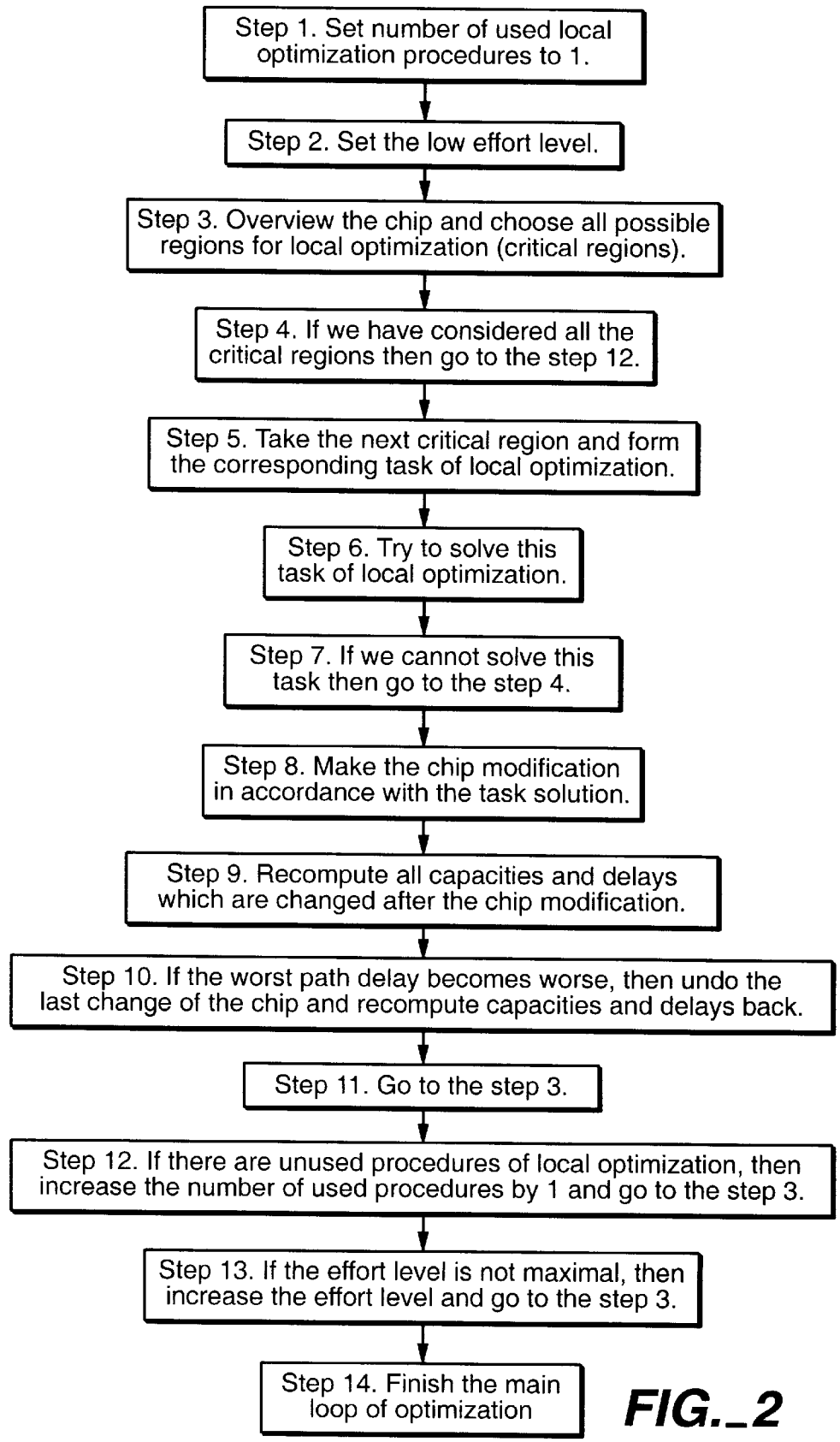
FIG._2

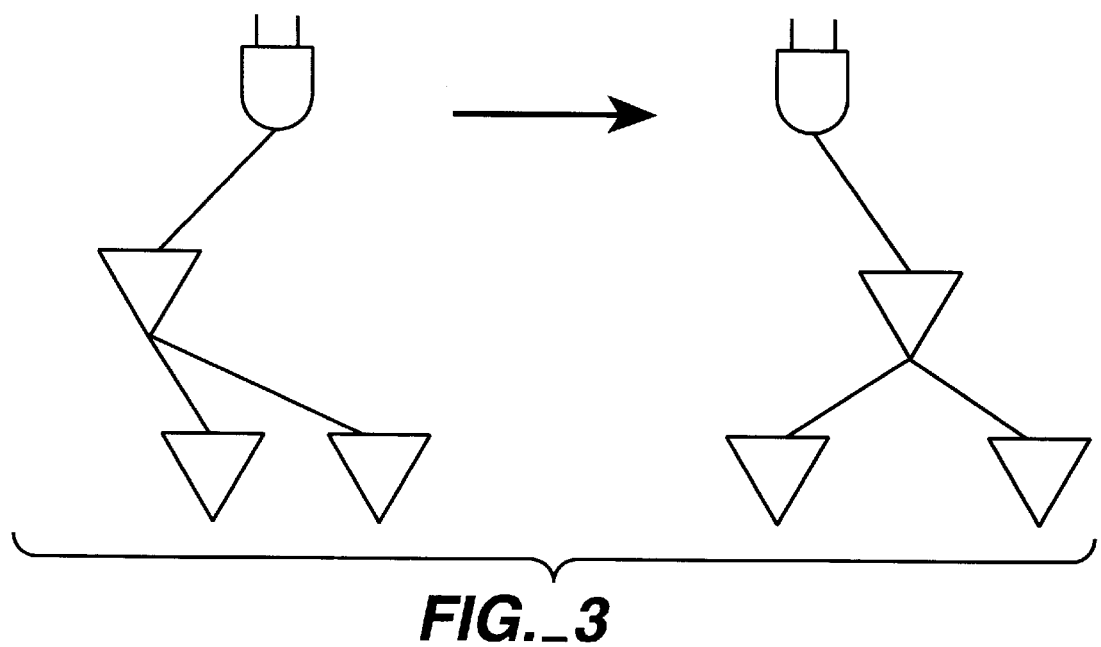
FIG._3
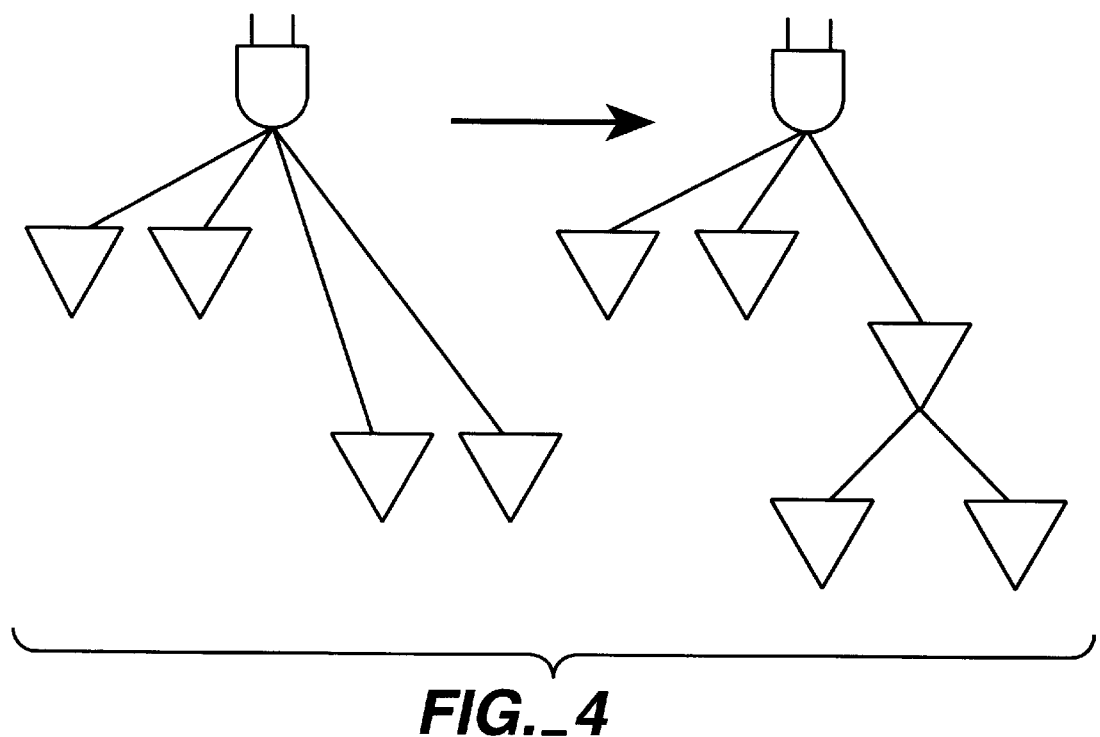
FIG._4

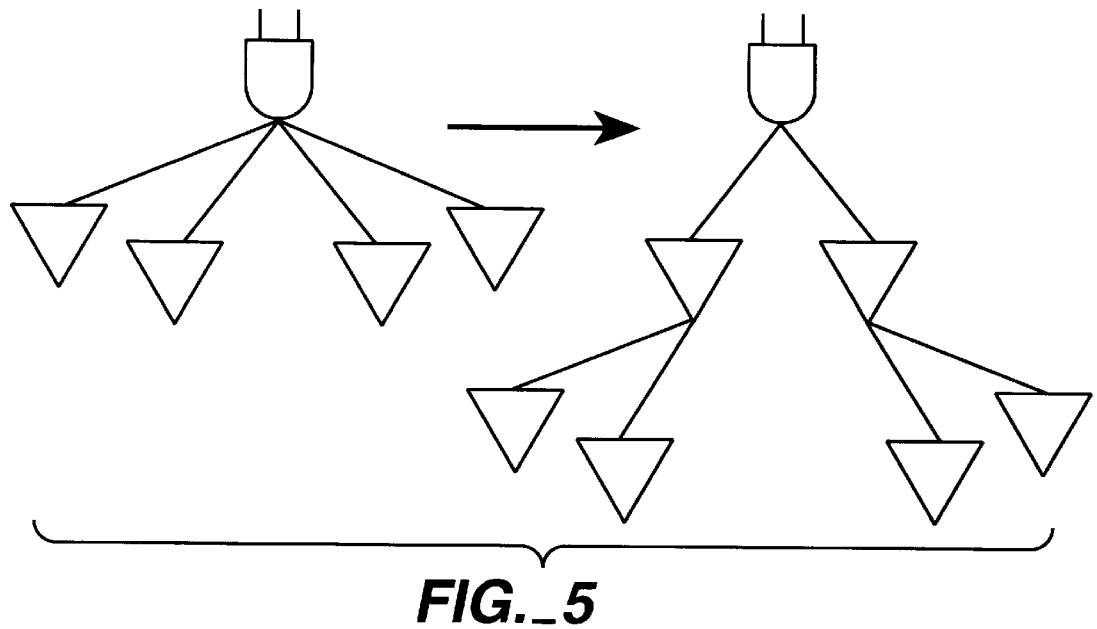
FIG._5
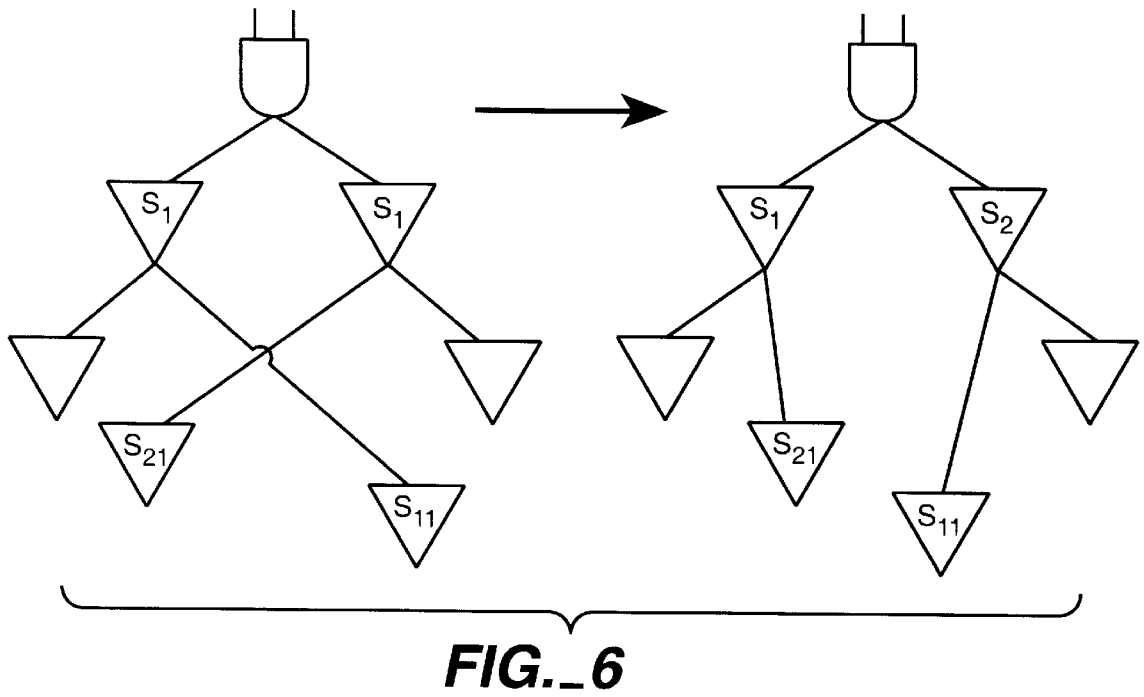
FIG._6

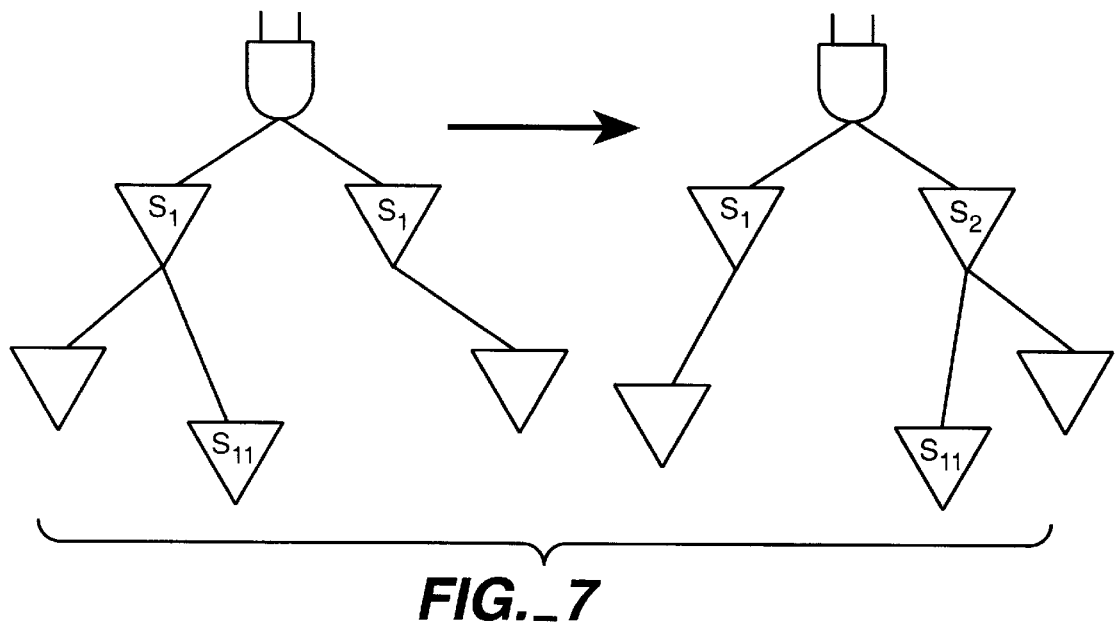
FIG._7
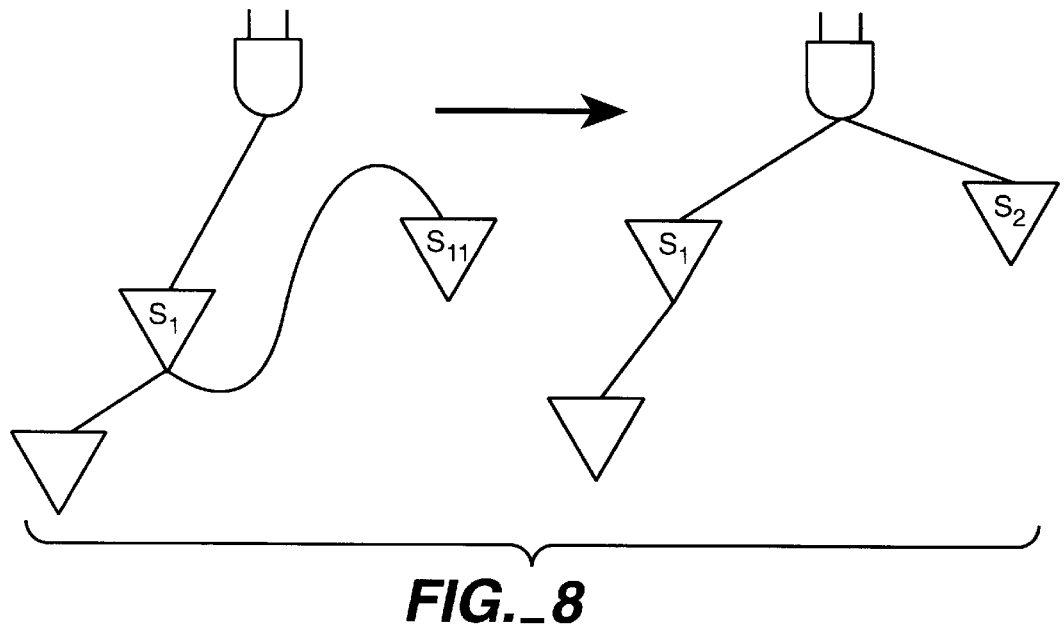
FIG._8

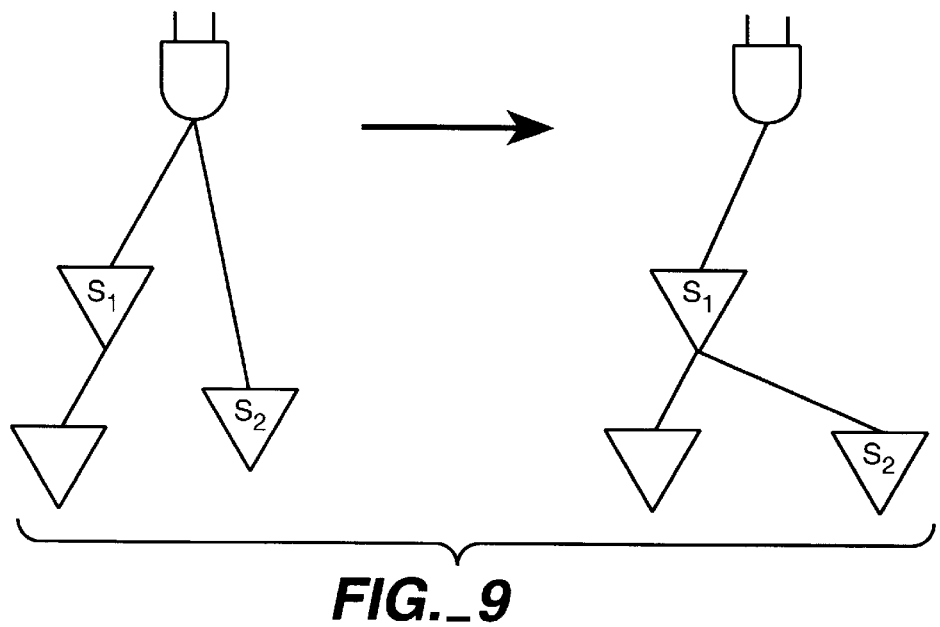
FIG._9
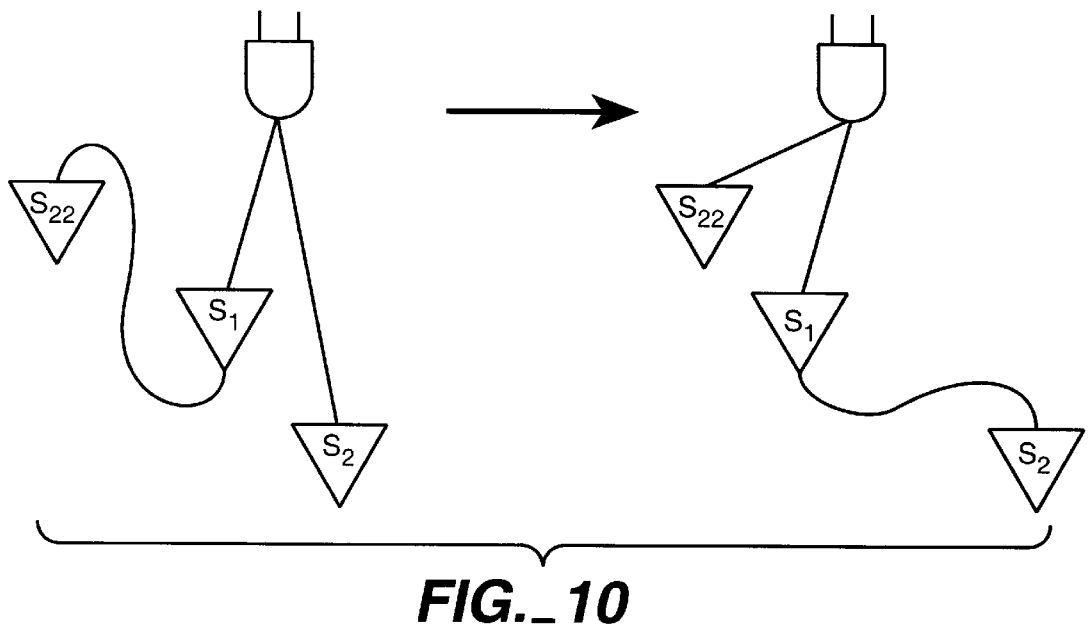
FIG._10

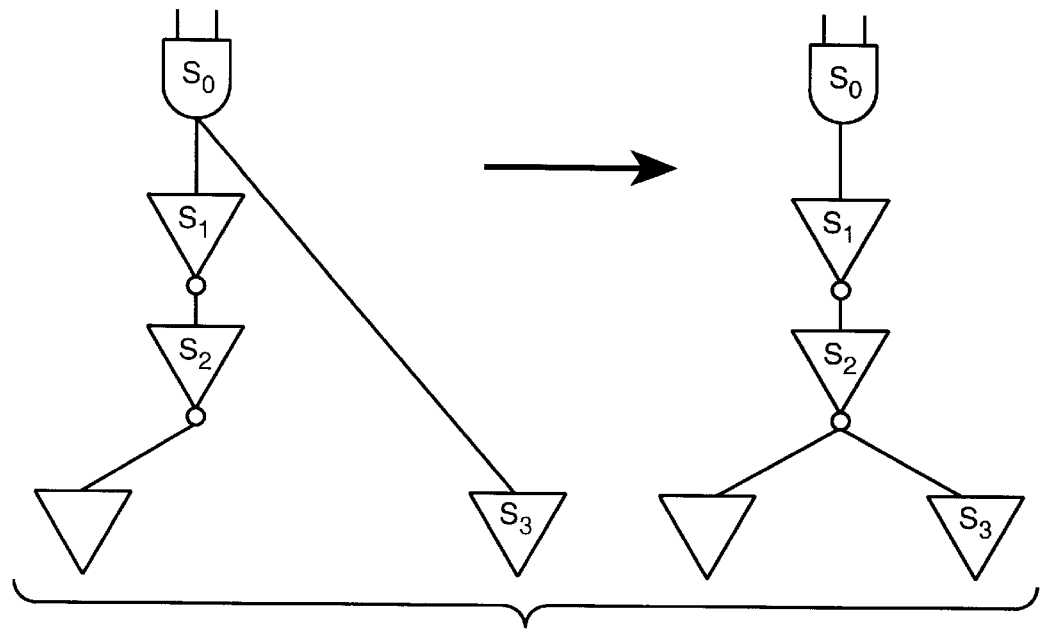
FIG._11
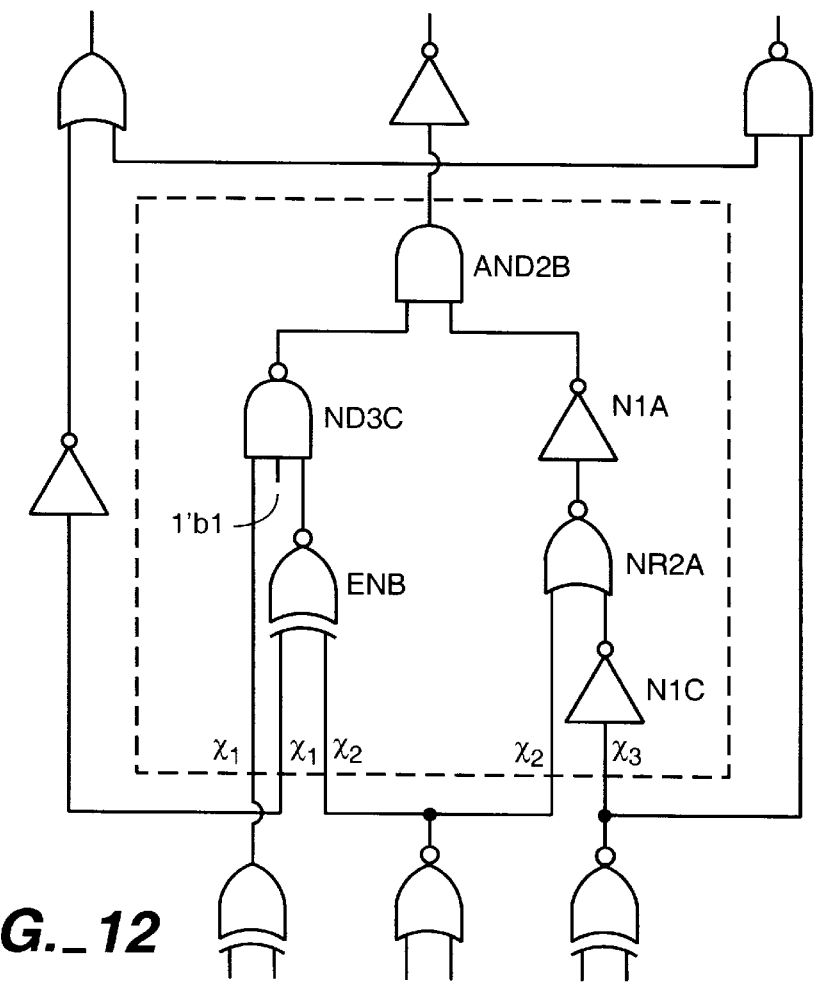
FIG._12

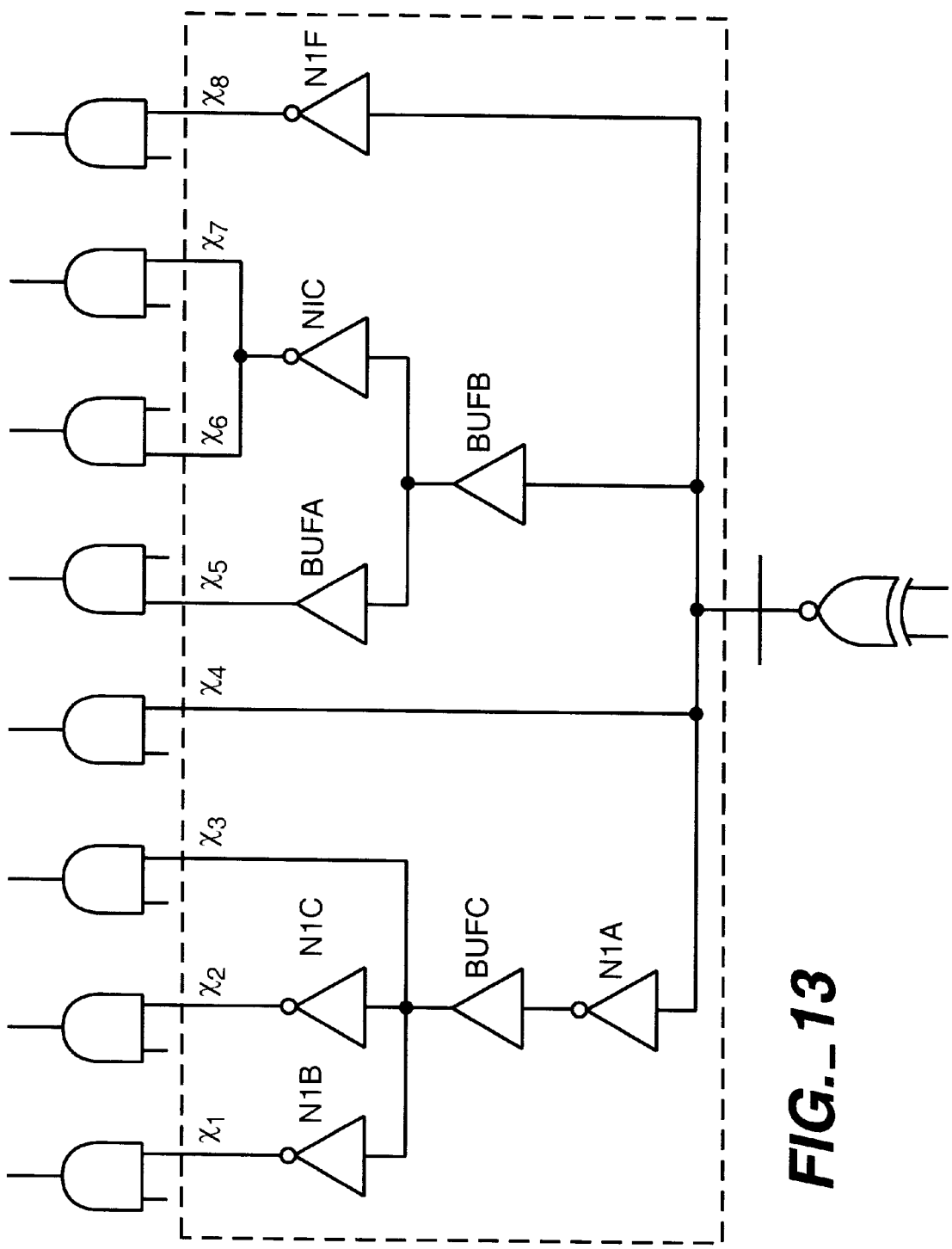
FIG._13

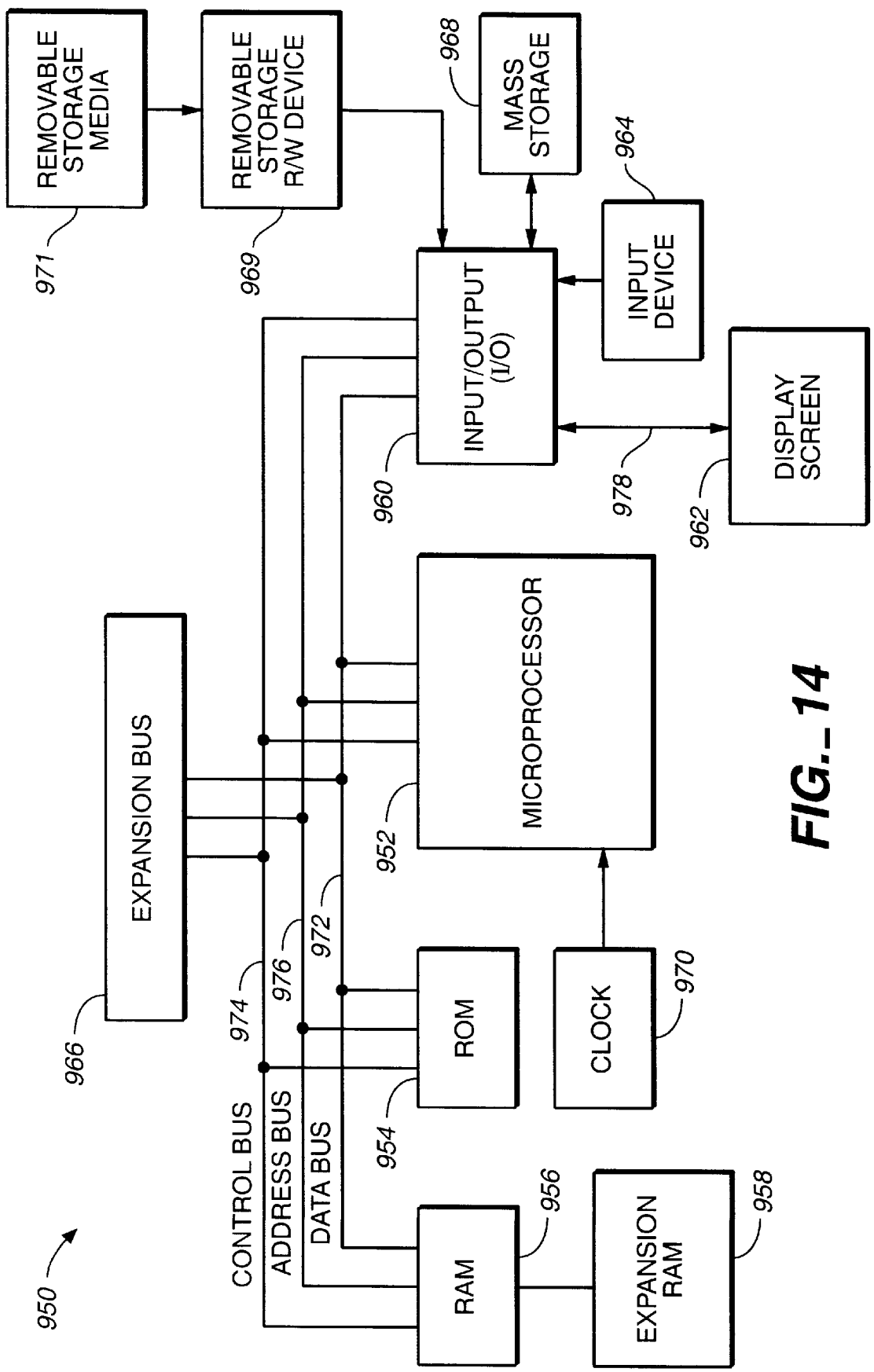
FIG._14

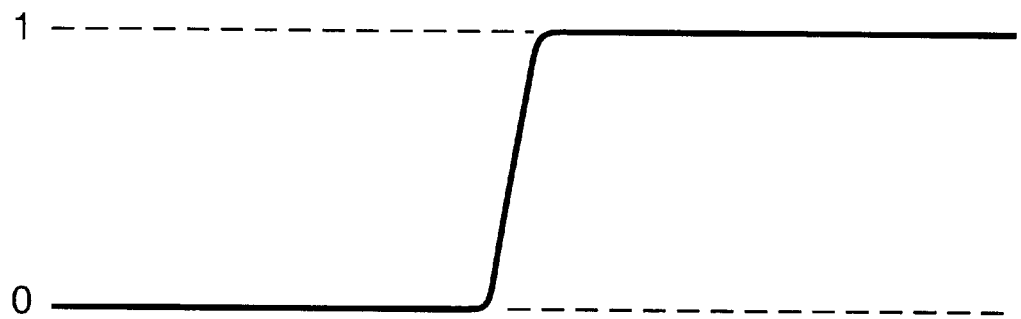
FIG._15A
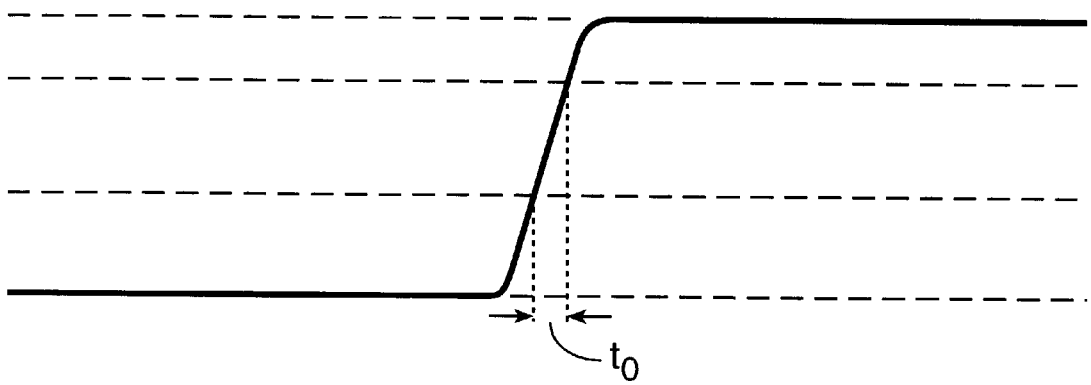
FIG._15B

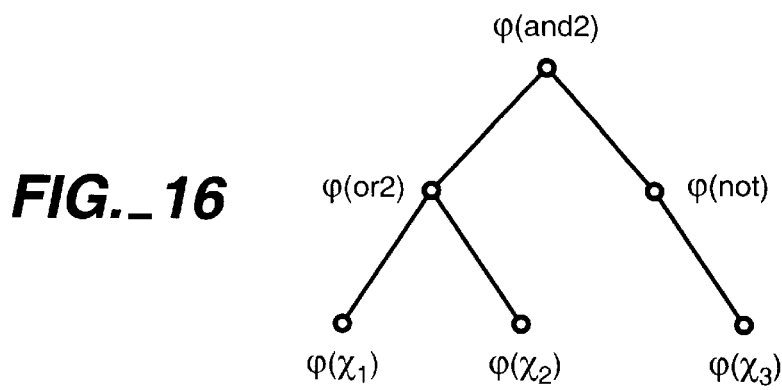
FIG._16
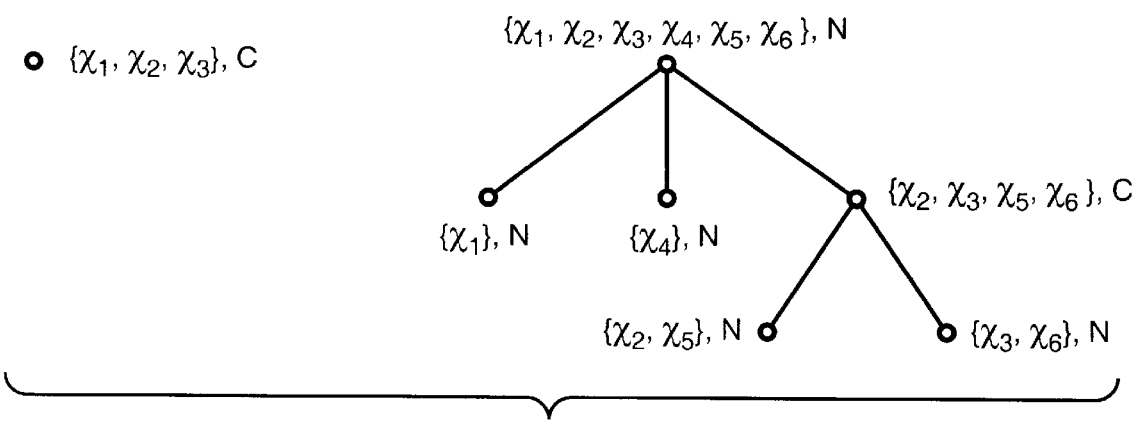
FIG._17
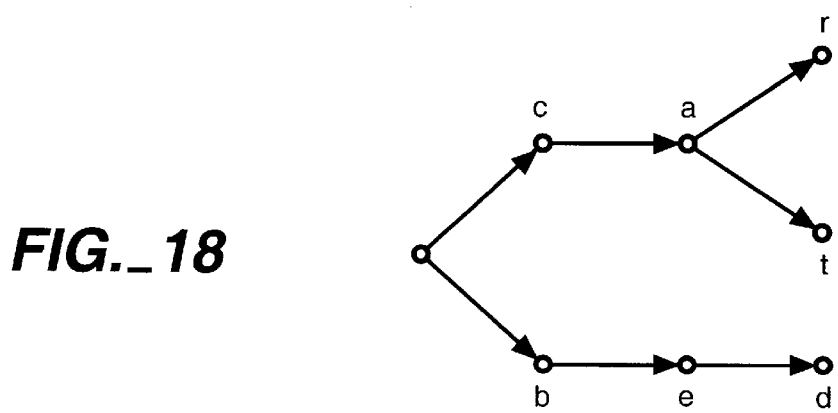
FIG._18

METHOD AND APPARATUS FOR TIMING DRIVEN RESYNTHESIS

BACKGROUND OF THE INVENTION

1. Field of the Invention

This invention relates to a method of analyzing, optimizing and resynthesizing integrated circuit (IC) designs.

2. Description of the Prior Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins. Some nets may include hundreds of pins to be connected. A netlist is a list of nets for a chip.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

A. IC Configuration

An exemplary integrated circuit chip is illustrated in FIG. 1 and generally designated by the reference numeral 26. The circuit 26 includes a semiconductor substrate 26A on which are formed a number of functional circuit blocks that can have different sizes and shapes. Some are relatively large, such as a central processing unit (CPU) 27, a read-only memory (ROM) 28, a clock/timing unit 29, one or more random access memories (RAM) 30 and an input/output (I/O) interface unit 31. These blocks, commonly known as macroblocks, can be considered as modules for use in various circuit designs, and are represented as standard designs in circuit libraries.

The integrated circuit 26 further comprises a large number, which can be tens of thousands, hundreds of thousands or even millions or more of small cells 32. Each cell 32 represents a single logic element, such as a gate, or several logic elements interconnected in a standardized manner to perform a specific function. Cells that consist of two or more interconnected gates or logic elements are also available as standard modules in circuit libraries.

The cells 32 and the other elements of the circuit 26 described above are interconnected or routed in accordance with the logical design of the circuit to provide the desired functionality. Although not visible in the drawing, the various elements of the circuit 26 are interconnected by electrically conductive lines or traces that are routed, for example, through vertical channels 33 and horizontal channels 34 that run between the cells 32.

B. Layout Design Process

The input to the physical design problem is a circuit diagram, and the output is the layout of the circuit. This is accomplished in several stages including partitioning, floor planning, placement, routing and compaction.

1. Partitioning.

A chip may contain several million transistors. Layout of the entire circuit cannot be handled due to the limitation of memory space as well as the computation power available. Therefore, the layout is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

2. Floor Planning and Placement.

This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

3. Routing.

The objective of the routing phase is to complete the interconnections between blocks according to the specified netlist. First, the space not occupied by blocks, which is called the routing space, is partitioned into rectangular regions called channels. The goal of a router is to complete all circuit connections using the shortest possible wire length and using only the channel.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes the exact channel routing of wires.

In order for circuit designers to calculate the performance of ASICs, the designers need to compute the delays of the cells in the ASICs. In the present invention, two types of delays are considered. The first type of delay is the propagation delay of a cell. A propagation delay of a cell is defined as the time duration a signal takes to travel from the input to the output of a cell. The measurement point at the input is called the switching threshold. The measurement point at the output is usually the 0.5 * Vdd (the power supply). A propagation delay of a cell is defined for every input to output pin combination of a cell under both the rising and falling input conditions. The propagation delay is also affected by a given process (P), voltage (V) and temperature (T).

The second type of delay is the setup/hold time delay which is an input constraint for sequential cells. The setup time is defined as the time duration a data signal is required to be available at the input of a cell before the clock signal transition, and the hold time is defined as the time duration a data signal is required to be stable after the clock signal transition. For the purpose of explanation, both propagation delay and setup/hold time, henceforth, will be referred as 'delay'.

SUMMARY OF THE INVENTION

The present invention comprises method for optimizing an integrated circuit design that includes computing of capacities and delays of an integrated circuit design, resynthesizing said integrated circuit design utilizing a plurality of local optimization procedures, and removing overlap the local optimization procedures can include a local resynthesis of logic trees procedure that utilizes multiple cost functions, a dynamic buffer and inverter tree optimization procedure, and a cell resizing procedure. Generally, faster local optimization procedures are applied first and slower, more thorough procedures are applied to areas where the faster procedures have not solved the optimization tasks.

The present invention also includes methods for generating identities in an integrated circuit design by creating lists of initial identities and repeatedly simplifying pairs of identities, wherein each pair has identifies for which there exists a consequence that is the result of the successive application of the identities.

The present invention also includes methods for optimizing integrated circuit design by selecting chip fragments comprising buffers and inverters and applying a plurality of optimization devices to the selected chip fragments. Such devices can include, for example, cell type modification; insertion of one buffer; insertion of several buffers; interchange of two grandchildren; making a grandchild into a child; making a child a grandchild; interchanging a child and a grandchild; eliminating two inverters; removing one buffer; removing more than one buffer; and removing two inverters.

The present invention also includes methods for optimizing integrated circuit designs that include determining a critical zone in an integrated circuit design, for a cell in said critical zone, identifying alternative identities that reduce ramptime, and selecting the alternative identity that provides the most significant reduction in ramptime.

BRIEF DESCRIPTION OF THE DRAWINGS

FIG. 1 is an exemplary integrated circuit chip.

FIG. 2 is a flowchart that illustrates the procedure of the present invention.

FIG. 3 illustrates a device that, for a specified internal vertex, chooses the optimal type, coordinates and flip and angle.

FIG. 4 illustrates a device that, for a specified internal vertex, chooses a subset of children of the vertex and designates these children as children of a new buffer.

FIG. 5 illustrates a device that finds a close to optimal partition of the set of children of this vertex into non-overlapping parts.

FIG. 6 illustrates a devices that selects two children of a specified vertex.

FIG. 7 illustrates a device that selects two children of the specified vertex, where the two children are simultaneously buffers or inverters.

FIG. 8 illustrates a device that selects a child buffer of the specified vertex, selects a child of the first child and makes the second child a child of the initial vertex.

FIG. 9 illustrates a device that selects two children $s_1$ and $s_2$ of the specified vertex, where $s_1$ is buffer; makes $s_2$ to be the child of $s_1$.

FIG. 10 illustrates a device that selects two children $s_1$ and $s_2$ of the specified vertex, where $s_1$ is buffer; selects a child $s_{11}$ of $s_1$ and makes $s_{11}$ to be the child of the initial vertex and $s_2$ to be the child of the $s_1$.

FIG. 11 illustrates a device that selects a descendant $s_1$ of the specified vertex, where $s_1$ is the inverter, selects a descendant $s_2$ of $S_1$, where $s_2$ is inverter, selects a child $S_3$ of the initial vertex, and makes $s_3$ to be the child of $s_2$.

FIG. 12 is an example of a logic tree.

FIG. 13 is another example of a buffer tree.

FIG. 14 is an illustration of a general purpose computer system, representing one of many suitable computer platforms for implementing the inventive IC design optimization methods described above.

FIG. 15 is an example of a signal behavior.

FIG. 16 is a representation of the formula and2(or2($x_1$, $x_2$), not($x_3$)).

FIG. 17 illustrates input symmetry trees of and3($x_1,x_2,x_3$) and mux41($x_1,x_2,x_3,x_4,x_5,x_6$).

FIG. 18 is a lexicographical tree of a set.

DETAILED DESCRIPTION OF THE PREFERRED EMBODIMENTS

II. SECTION 1

Introduction

The Timing Driven Resynthesis procedure described herein resynthesizes a chip netlist in order to minimize path delays, eliminate ramptime violations and minimize the total cell area. It can be applied at different points during the chip design process. For example, it can be applied after cell placement or after clock buffer insertion.

III. SECTION 2

Timing Driven Resynthesis

The Timing Driven Resynthesis procedure starts with a chip that has a preliminary cell placement. Some of the cells are declared as fixed. A lattice covering the chip area is then created, with a typical distance between neighboring lattice points being 15 grids. Each nonfixed cell is then shifted to the nearest point of the lattice.

This lattice step is performed before the initial computation of the capacities and of the delays. This lattice step is not essential, and it can be skipped. Nevertheless, all cells are always placed in rows, so the vertical dimension of the lattice appears naturally.

As is described more fully below, the Timing Driven Resynthesis procedure comprises of the following basic steps:

1) Initial computation of capacities and delays.
2) General resynthesis procedure.
3) Overlap removal.

For purposes of the overlap removal, the Overlap Remover With Minimal Noise described in the U.S. Pat. No. 6,026,223, issued to Scepanovic et al on Feb. 15, 2000, can be utilized for this purpose. The specification and claims of U.S. Pat. No. 6,026,223 is incorporated herein by this reference.

A. Initial Computation of Capacities and Delays

At first, net capacities are computed. Let w be an arbitrary net (that is a set of cell pins connected with a wire), and let n be the number of cell pins in the net, ($x_1$, $y_1$), . . . , ($x_n$, $y_n$) the coordinates of these pins, and $c_1$, . . . , $c_n$ the capacities of the pins. We denote by $$d(w) = k(n) \cdot (\max_i\{x_i\} - \min_i\{x_i\} + \max_i\{y_i\} - \min_i\{y_i\})$$

the estimated length of the net w where k(1), k(2), k(3), . . . are some statistical coefficients. $\max_i\{x_i\}$ means "the maximum of the values $x_i$", and $\min_i\{x_i\}$ means "the minimum of the values $x_i$". $\max_i\{x_i\} - \min_i\{x_i\} + \max_i\{x_i\} - \min_i\{x_i\}$ is a half of the perimeter of the bounding box of the pins (of the minimal rectangle that contains all these pins). k(1), k(2), k(3), . . . is a sequence of numbers, and the coefficient k(n) do not depend on the types of the pins, types of the cells, or on any other characteristics. This is a sequence of fixed numbers. For example, k(1)=1, k(2)=1, k(3)=1.1, k(4)=1.2 and k(n)=1.3 for all n≧5. In fact, defining these value we consider a couple of designs and set k(n) to be equal to the average value of d/dbound of all n-pin nets, where d is the real length of the wire connecting the pins of the net, and dbound is half of the perimeter of the corresponding bounding box.

The capacity of the net w is equal to $$Cap(w) = UnitCap \cdot d(w) + \sum_{i=1}^{n} c_i$$

where UnitCap is the capacity of a unit length of wire.

Then we compute all cell and wire delays. Let $P_{in}$ be an input pin of a cell, and $P_{out}$ an output pin of the same cell. We compute a delay of the edge ($P_{in}, P_{out}$) of the cell as a sum of the transition delay and of the intrinsic delay of the cell CellDelay($P_{in}, P_{out}$)=transition($P_{in}, P_{out}$, Cap(w))+intrinsic($P_{in}, P_{out}$, Cap(w))

where Cap(w) is the capacity of the net w connected with the pin $P_{out}$. A cell delay depends on the cell type, on the input and output pins, and on the capacity of the net connected with the output pin. All wires are short enough after the elimination of ramptime violations, so we may assume that the cell delay does not depend on the input pin ramptime.

The notions of intrinsic delay and transition delay are well known and are commonly used by chip design engineers. When a signal changes it value (from 0 to 1 for example), it does not do so immediately. An example of a signal behavior is shown in FIGS. 15A and 15B.

There are two values defined by the given technology. The first one (0.3 for example) is the maximal value that is meant to be the zero signal, and the second one (0.7 for example) is the minimal value that is considered as 1.

That is we assume that this signal is 0 if it value is not greater that 0.3, and the signal is 1 if it value is not less that 0.7. Between these two values the signal is neither 0 nor 1. The transition delay is the duration $t_0$ of the "undefined" stage of the signal on the output pin. The intrinsic delay is another part of the cell delay. This delay is the time that the signal takes to go from input pin to output pin. For example, let us consider the OR cell. Initially the signals on both input pins of the cell were equal to 0 (it means that the output signal was equal to 0 as well). Then the signal on one of the input pins was changed to 1. If $t_{in}$ is the last time when the input signal was equal to 0, $t_{out}$ is the last time when the output signal was equal to 0, and $t_{out}$, 1 is the first time when the output signal is 1, then the intrinsic delay is equal to $t_{out}$, 1−$t_{out}$.

If $P_{out}$ is an output pin of a cell, $P_{in}$ is an input pin of another cell, and pins $P_{out}, P_{in}$ are connected with a wire, then we compute a wire delay on the edge ($P_{out}, P_{in}$) using the formula WireDelay($P_{out}, P_{in}$)=½·Unitcap·UnitRes·$d^2$+UnitRes·d·$c_{in}$, where $c_{in}$ is the capacity of the pin $P_{in}$, UnitCap is the capacity of a unit length wire, d=|$x_{out}-x_{in}$|+|$y_{out}-y_{in}$|, and ($x_{in}, y_{in}$), ($x_{out}, y_{out}$) are the coordinates of the pins. UnitRes is the resistance of a unit length of a wire. We assume that a wire of the length d has the resistance d·UnitRes and the capacity d·UnitCap. Of course, this is only an estimation.

Let w be a net. For any output pin $P_{out}$ in the net w we define the ramptime on the pin $P_{out}$ $$\text{Ramptime}(P_{out}) = \max_P \{\text{transition}(P, P_{out}, \text{Cap}(w))\}$$

where P runs all input cell pins connected with $P_{out}$ by an edge. For any input cell pin $P_{in}$ in the net the ramptime degradation on this pin can be computed by the formula $$\text{RampDegr}(P_{in}) = \frac{1}{4} \cdot d(w) \cdot \text{UnitRes} \cdot (\text{Cap}(w) + c_{in})$$

where $c_{in}$ is the capacity of the pin $P_{in}$. Consider the ramptime of the net w $$\text{Ramptime}(w) = \max_{P_{in}} \{\text{RampDegr}(P_{in})\} + \max_{P_{out}} \{\text{Ramptime}(P_{out})\}$$

where $P_{in}$ runs the input cell pins in the net, and $P_{out}$ runs the output cell pins in the net. One of the goals of resynthesis is to decrease large ramptimes of nets so that for all nets w the ramptime Ramptime(w) does not exceed the given value MaxRamptime. The value $$\max\{0, \text{Ramptime}(w) - \text{MaxRamptime}\}$$

is called the ramptime violation of the net w. We have to eliminate all ramptime violations of the net.

An important point of the procedure is the computation of the arrival and output times for the pins. We assume that the description of the chip contains the description of one or more so called intervals. An interval description consists of the following data:

1) The starting list of cell pins (with interval start times for all these pins).
2) The ending list of cell pins (with interval end times for all these pins).
3) The required time of the interval.

We consider all paths starting from the first set of pins and ending on the second set. Additionally, we have a list of false pins. All paths through these pins are not considered. The main purpose of the chip resynthesis is to optimize the worst path delays of the intervals. These delays should be less than the required times of the intervals. If the required time of the interval is less than the path delay, then we say that there is a non-zero timing violation of the path.

B. General Resynthesis Procedure

The general procedure of resynthesis is based on the following three procedures of local optimization:

1) Local Resynthesis of Logic Trees With Multiple Cost Functions (described more fully in Section 5 herein) to restructure a logic tree. This procedure is based on the list of identities prepared by the procedure of Automatic Generation of Identities in Technology Library described in Section 3 herein.
2) Dynamic Buffer and Inverter Tree Optimization (described more fully in Section 4 herein) to optimize a tree of buffers and inverters.
3) Cell resizing to change a type and a position of one cell.

Other procedures of local optimization can be used as well.

Throughout the resynthesis process, we change the chip step by step, applying the procedures of local optimization. We select possible groups of cells for the optimization and then make an Optimal Critical Netlist Area Selection as described in Section 7. Local optimization procedures work with these tasks only. Each task describes the cell group to be resynthesized, and an approximate situation of the neighborhood of this cell group (cells, capacities, delays, etc.). In spite of the approximation, a solution of a local optimization task usually gives an improvement of the chip.

One of the concepts of the resynthesis procedure described herein is the principle of the gradual rise of the effort. Preferably, there are three effort levels for all procedures of local optimization. The first level of each procedure is the fastest, and the last one is the more thorough. We use only one of the local optimization procedures with the low effort level at the beginning of the resynthesis. When we can do nothing more we extend the list of used local optimization procedures or increase the effort level.

The general procedure comprises four stages of the resynthesis:

1) Ramptime optimization.
2) Timing optimization.
3) Area optimization.
4) Density optimization.

Each of these stages are organized as follows.

1) Set the number of used local optimization procedures to 1.
2) Set the low effort level.
3) Overview the chip and choose all possible regions for local optimization (critical regions).
4) If we have considered all the critical regions then go to the step 12.
5) Take the next critical region and form the corresponding task of local optimization.
6) Try to solve this task of local optimization.
7) If we cannot solve this task then go to the step 4.
8) Make the chip modification in accordance with the task solution.
9) Recompute all capacities and delays which are changed after the chip modification.
10) If the worst path delay becomes worse, then undo the last change of the chip and recompute capacities and delays back.
11) Go to the step 3.
12) If there are unused procedures of local optimization, then increase the number of used procedures by 1 and go to the step 3.
13) If the effort level is not maximal, then increase the effort level and go to the step 3.
14) Finish the main loop of optimization.

This procedure is illustrated by the flowchart in FIG. 2.

Each of these steps has its own goal of the resynthesis, list of used local optimization procedures, and the choice rule for critical regions (in any case, we select the following kinds of regions: trees of logic cells for the logic resynthesis procedure, trees of buffers and inverters for the buffer optimization procedure, and solitary cells for the cell resizing procedure).

The main goal of the ramptime optimization is to eliminate all ramptime violations of the nets. At the same time, we try to reduce the current worst delay or at least to keep it. It is necessary to avoid the appearance of ramptime violations within all the next stages of resynthesis. We select neighbors of the ramptime violated nets as critical regions. The list of local resynthesis procedures used at this stage is as follows:

1) The buffer optimization procedure.
2) The cell resizing procedure.

At the next stage of resynthesis, we optimize worst path delays removing timing violations. Critical regions here are the regions in paths with timing violations. At this stage, we apply all local optimization procedures in the following order:

1) The logic resynthesis procedure.
2) The buffer optimization procedure.
3) The cell resizing procedure.

We use the area optimization stage to reduce the total cell area down to the given value. All possible regions of the chip are considered as critical regions. We consider only attempts of area optimization which do not introduce new timing violations. The following local optimization procedures are applied to reduce the total cell area.

1) The logic resynthesis procedure.
2) The cell resizing procedure.
3) The buffer optimization procedure.

Finally we remove the overflows of lattice points. The use of this resynthesis stage helps the overlap remover to place cells better. Only the local optimization procedure means to be used is the cell resizing. Critical regions in this case are the cells in overflowed lattice points. We may not increase the worst path delay or the total cell area at this stage.

IV. SECTION 3

Automatic Generation of Identities In Technology Library

The purpose of the Automatic Generation of Identities in Technology Library procedure is to develop a procedure that takes a specific technology library as the input and automatically generates a variety of simplifying identical transformations in this library for area optimization.

Utilization of this procedure eliminates the necessity of a time and labor consuming process of manual development of the simplifying transformation package after every modification of the technology basis. Identities generated by the procedure can be used not only for area optimization, but also for the Local Resynthesis of Logic Trees with Multiple Cost Functions procedure described in Section 5 herein.

A variety of transformations generated by the procedure is non-abundant in a sense that none of the transformations can be obtained by a sequence of other transformations of the variety. Because of this feature, the number of simplifying identifies required for optimization is greatly reduced, so we get an opportunity either to speed up the optimization or to enhance its depth and hence to improve the quality.

A. General Scheme of Procedure

The general scheme of the procedure is the following:

1. We create the list B of the initial identities, i.e. the union of the axioms for the elementary logic operations of negation, conjunction, and disjunction, and of the definitions of functions of logic cells of the technology basis expressed in terms of these logic operations. These elementary logic operations, as well as related identity functions, are described in U.S. patent application Ser. No. 09/626,037, entitled "Method and Apparatus for Locating Constants in Combinational Circuits," which is incorporated herein by this reference as though set forth in full.

2. We look through all pairs of identities $T_1$, $T_2$ of the list B for which there exists a consequence T that is the result of successive application of $T_1$ and $T_2$. The left and the right part of every consequence are simplified (in a sense of the total cell area reducing) by applying all possible identity L=R. If this identity satisfies certain conditions of identity selection (e.g. the limit on the number of variables or on the length), then it is added to the identity concentrator. The identities from the concentrator are also used in the process of simplification, along with the identities from the system B.

Examples of consequence generation ($T_1$, $T_2 \rightarrow T$):

$$\overline{pvb} = p \cdot \overline{b}$$

a. $T_1$: $\overline{avb} = \overline{a} \cdot \overline{b}$;   $T_2$: $\overline{\overline{p}} = p$ For successive application of $T_1$, $T_2$ we identify $\overline{a}$ and $\overline{p}$. Then $T_1$ transforms to:

$$\overline{pvb} = \overline{\overline{p}} \cdot \overline{b}.$$

After the application of $T_2$ this gives:

(*)

Now we have to simplify left and right parts of (*), using all possible identities from our library. Let us suppose that we already have in library an identity:

$$\overline{a}vb = (a \rightarrow b).$$

Then we reduce (*) to form:

$$\overline{p \rightarrow b} = p \cdot \overline{b} - \text{identity} T.$$

b. $T_1$: $a(bvc) = abvac$; $T_2$: $p\overline{q} = \overline{p \rightarrow q}$.

We identify ab; $p\overline{q}$. $T_1$ transforms to:

$$p(\overline{q}vc) = p\overline{q}vpc.$$

After application of $T_2$:

$$p(\overline{q}vc) = \overline{p \rightarrow q}vpc.$$

After reduction:

$$p(q \rightarrow c) = (p \rightarrow q) \rightarrow pc - \text{identity} T.$$

Let us designate AO(x,y,z) = $\overline{xyvz}$; NOR(x,y) = $\overline{xvy}$.

$T_1$: AO(a,b,c) = NOR(a,b,c); $T_2$: $\overline{p} \cdot \overline{q}$ = NOR(p,q).

We identify a·b; $\overline{p} \cdot \overline{q}$. Then $T_1$ transforms to:

$$AO(\overline{p}, \overline{q}, c) = NOR(\overline{p} \cdot \overline{q}, c).$$

After application of $T_2$:

$$AO(\overline{p}, \overline{q}, c) = NOR(NOR(p,q), c) - \text{identity} T.$$

3. After the cycle of the step 2) ends, we add all the identities from the concentrator to the list B. After that we look through B once again and try to simplify the left and the right part of every identity T by applying the other identities from B. If the left part L and the right part R become equal, we remove T from B; otherwise T is replaced by L=R.

4. If the cycles of the steps 2) and 3) have not enlarged B, the process is stopped. Otherwise we return to the step 2).

B. Supplementary Procedures

We take the description of the technology basis, and extract the identities that reflect the functions implemented in the cells of this basis in terms of the elementary logic operations (negation, conjunction and disjunction). Then we add the axioms that express the main properties of these elementary operations. The initial identities are organized in a way that the area of the right (replacing) part is not greater than the area of the left part. If the areas are equal, then the right part is smaller than the left one in a sense of the lexicographical order. When evaluating the area for every logic operation we select the cell of the technology basis that implements this operation and has the minimal area.

While generating the identities, we utilize the following supplementary procedures.

1. The procedure of applying the identities from B to the formula f is just applying the identities from B that reduce the total area of cells to f as long as it is possible. When applying the identities, we use the property of symmetry of logic operations (see the description of the Quick Search for Identities Applicable to Specified Formula procedure set forth in Section 6 herein).

2. The procedure of reducing the identity $P_1=P_2$ with the help of the system B works in the following way.

a. We evaluate the results $Q_1$, $Q_2$ of applying the identities from B to $P_1$, $P_2$.

b. If the identity $Q_1=Q_2$ contains an expression R, where R is not a variable and all the variables from R can be found in $Q_1$, $Q_2$ only inside R, we select a variable x that does not occur in $Q_1=Q_2$; and replace every occurrence of R in $Q_1=Q_2$ by x (this transformation is applied as long as it is possible). Let us suppose that our consequence is of form:

$$(ab\to c)\cdot(ab\to d)=(ab\to c\cdot d). \quad (*)$$

Here an expression R=ab have variables a, b, and this variables can be found in (*) only inside R. Values c, d, are independent from value R, and expression R can get both values 0, 1, independently from c, d. Hence, an identity $$(e\to c)\cdot(e\to d)=(e\to c\cdot d)$$

is true for all values of c, d, e (new variable "e" designate here an expression R). The choice of variable for R is quite arbitrary, but this variable have not to occur in identity $Q_1=Q_2$.

c. Using the property of symmetry of operations from $Q_1$, $Q_2$, we rearrange the operands in order to get the "standard" formulas $S_1$, $S_2$. Standard forms $S_1$, $S_2$ for $Q_1$, $Q_2$ are simply lexicographical reordering of operands for symmetrical operations. For example, if we have identify avbc=cbva, we replace "cb"→"bc", and then, "bcva"→"avbc", so our identity transforms to avbc=avbc. This transformation simplify recognition of "trivial" identities.

d. If $S_1$ and $S_2$ are equal, we take 0 as the result of reduction. Otherwise we check whether the total areas for cells of $S_1$ and $S_2$ are different. If they are different, the result of reduction is $S_1=S_2$, where the area of $S_1$ is greater than the area of $S_2$. If the areas are equal, we apply all identities from B that either reduce the area or reduce the value in terms of the lexicographical order, and obtain $D_1$, $D_2$ as a result. If $D_1$ is equal to $D_2$ the result of reduction is 0; otherwise, the result is $D_1=D_2$ where either the area of the right part is smaller than the area of the left part or the areas are equal and the right part is smaller in terms of the lexicographical order.

C. Cycle of Automatic Generation of New Identities

1. Given a number n, we select n shortest (in terms of the number of operations occurring in the formula) identities $P_{11}=P_{21}, \ldots, P_{1n}=P_{2n}$ from B (the identities are sorted by length in ascending order).

2. i:=1, go to the step 3.

3. j:=1, go to the step 4.

4. We successively apply the rule of Inference R to the pairs $(P_{1i}=P_{2i}, P_{1j}=P_{2j})$ and $(P_{1j}=P_{2j}, P_{1i}=P_{2i})$ (if i=j, the rule is applied to one pair). The result is a set of identities $T_1=T_k$. To every $T_m$ we apply the procedure of reducing with the help of B; if the result $T^*$ is equal to 0, it is added to B (the addition is performed immediately, before processing $T_{m+1}$). After processing two pairs (in case i=j –one pair), we transit to the step 5.

5. If j=n, we transit to the step 6, otherwise i:=j+1, transit to the step 4.

6. If i=n, end cycle; else i:=i+1, transit to the step 3.

After the identities inference cycle is over, we apply the reduction cycle, looking through every identity T from B, trying to reduce T by all other identities of B, and looking at the result $T^*$. If $T^*$ is different from T and $T^*$ is different from 0, we replace T in B by $T^*$; if $T^*=0$, T is excluded from B.

D. Rule of Inference

The rule of the inference, mentioned in the previous section, is applied to a pair of identities $(P_{11}=P_{12}, P_{12}=P_{22})$ the acts in the following way.

1. All the variables of the second identity are renamed so that none of them occur in the first identity.

2. If the head of the left part of any identity $P_{1i}=P_{2i}$ (i=1, 2) is a symbol of an associative and commutative operation f, i.e. $P_{1i}=f(t_1, \ldots, t_s)$, and there are no variables x such that some $t_i$ is x, and $P_{2i}$ looks like $f(q_1, \ldots, q_{m-1}, x, q_{m+1}, \ldots, q_1)$, x does not occur in $t_i, \ldots, t_{j-1}, t_{j+1}, \ldots, t_s, q_1, \ldots, q_{m-1}, q_{m+1}, \ldots, q_r$, then we select a new (not occurring in this pair of identities) x and replace $P_{1i}=P_{2i}$ by $f(x, t_1, \ldots, t_s)=f(x, P_{2i})$ (if $P_{2i}$ looked like $f(q_1, \ldots, q_r)$–by $f(x, t_1, \ldots, t_s)=f(x, q_1, \ldots q_r)$).

3. We find the head g of an expression $P_{12}$, and successively look through the occurrences A of the symbol g in $P_{11}$. For every A which is an occurrence in $P_{11}$ of the root of a subformula Q, we unify the terms Q and $P_{12}$. This procedure utilizes the property of symmetry of the logic operations under consideration and produces a collection of substitutions S of terms $d_1, \ldots, d_m$ for the variables $y_1, \ldots, Y_m$ (all the variables from Q, $P_{12}$) such that $S(Q)=S(P_{12})$ (within the accuracy of symmetry transformations). It is generation of unification procedure in Section 6 herein. For every substitution S we perform the following actions.

a. Find the best $P_3$ of a substitution of the occurrence A of a subformula Q in $P_{11}$ by $P_{22}$.

b. Form an identity T: $S(P_3)=S(P_{21})$.

c. If T looks like $f(y, v_1, \ldots, v_q)=f(y, w_1, \ldots, w_p)$, where y is a variable not occurring in $v_1, \ldots, v_q, w_1, \ldots, w_p$, f is a associative and commutative operation, then T is replaced by $f(v_1, \ldots, v_q)=f(y, w_1, \ldots, w_p)$ (if after that f has just one argument, f is dropped).

d. The identity T is set as a result of the current step of the rule of inference R, and we proceed to the next unifying substitution S.

V. SECTION 4

Dynamic Buffer and Inverter Tree Optimization

The purpose of the Dynamic Buffer and Inverter Tree Optimization procedure is to optimize buffer and inverter trees with the three cost functions: remove ramptime violation, reduce the path delays and minimize the cell area. This procedure can be applied as part of the Timing Driven Resynthesis procedure described in Section 2 herein.

We select "critical" tree-like chip fragments consisting of buffers and inverters (referred as buffer trees), and utilize the Optimal Critical Netlist Area Selection procedure described in Section 7. Present invention is applied to each of this selected Local Resynthesis Tasks independently.

Every vertex of a tree except for the root vertex has one parent and, generally speaking, several children. If a vertex has no children, it is called hanging, other vertices care called internal. The root of a buffer tree is a vertex that accepts the in-coming signal (usually it is represented by an output pin of a logic cell); the internal vertices of buffer tree are buffers and inverters; the hanging vertices are input pins of cells. The target is to obtain a buffer tree equivalent to the initial, one that is closer to the goals of the Local Resynthesis Task than the initial tree.

The process consists of the cyclic application of a random sequence of some or all of 13 devices; some of the devices can be skipped depending on the main cost function. The process is stopped when none of the devices are applicable or when the goal of the Local Resynthesis Task is achieved.

A. Device Application

Every device is applied to an internal buffer tree vertex; hence a device is inapplicable to a tree if and only if it is inapplicable to any of internal vertices. Every device describes a transformation that is applied only if the result of this transformation is a buffer tree closer to the goals o the Local Resynthesis Task. Note that the conditions of the Local Resyntehsis Task are corrected after every device application.

B. Item-by-Item Examination Reduction

All of the devices select supplementary information about the neighborhood of the specified vertex. As a result of this information, we get an opportunity to reduce an item-by-item examination with the help of some heuristics. The reduction scale depends on the level of the effort applied (see Timing Driven Resynthesis described in Section 2 herein).

The following includes details concerning 13 devices.

1. Cell Type Modification (Cell Resizing)

For a specified internal vertex this device chooses the optimal type, the optimal coordinates from some neighborhood of the current coordinates, and the optimal flip and angle. This is illustrated by FIG. 3.

2. Insertion of One Buffer

For a specified internal vertex this device chooses a (preferably optimal) subset of children of the vertex, and designates these children as children of a new buffer, which itself becomes the child of the initial vertex. We select the optimal type for the new buffer and the coordinates of the new buffer close to the mass center of pins connected to it. This is illustrated by FIG. 4.

3. Insertion of Several Buffers

For a specified internal vertex, this device finds a close to optimal partition of the set of children of this vertex into non-overlapping parts. If the number of parts in n, then we introduce n new buffers. The children of the part i become the children of the buffer i, and the children of the initial buffer are the n new buffers. The type of the new buffers are the same. They are selected to be optimal (if it is possible). This is illustrated by FIG. 5.

4. Interchange of Two Grandchildren

A child of a child is called a grandchild. This device selects two children of the specified vertex. We denote these children by $s_1$ and $s_2$, and assume that $s_1$ and $s_2$ are simultaneously buffers or inverters. This device selects a child $s_{11}$ of $s_1$ and a child $s_{21}$ of $s_2$ and turns $s_{11}$ into the child of $s_2$ and $s_{21}$ to be the child of $s_1$. This is illustrated by FIG. 6.

5. Alignment

This device selects two children $s_1$ and $s_2$ of the specified vertex, where $s_1$ and $s_2$ are simultaneously buffers or inverters; selects a child $s_{11}$ of $s_1$ and turns $s_{11}$ into the child of $s_2$. The type of $s_2$ s changed in an optimal way. This is illustrated by FIG. 7.

6. Sending Off (Making Grandchild into Child)

This device selects a child buffer $s_1$ of the specified vertex, selects a child $s_{11}$ of $s_1$ and turns $s_{11}$ into the child of the initial vertex; the initial vertex type is selected to be optimal. If $s_{11}$ is the only child of $s_1$, then $s_1$ should be deleted. This is illustrated by FIG. 8.

7. Sending In (Making Child into Grandchild)

This device selects two children $s_1$ and $s_2$ of the specified vertex, where $s_1$ is buffer; turns $s_2$ into the child of $s_1$. The type of $s_1$ is changed in an optimal way. This is illustrated by FIG. 9.

8. Interchange of Child and Grandchild

This device selects two children $s_1$ and $s_2$ of the specified vertex, where $s_1$ is buffer; selects a child $s_{11}$ of $s_1$ and turns $s_{11}$ into the child of the initial vertex and $s_2$ to be the child of the $s_1$. This is illustrated by FIG. 10.

9. Moving Through Two Inverters

This device selects a descendant $s_1$ of the specified vertex, where $s_1$ is the inverter, selects a descendant $s_2$ of $s_1$, where $s_2$ is inverter, selects a child $s_3$ of the initial vertex, and turns $s_3$ into the child of $s_2$. The type of $s_2$ is changed in an optimal way. This is illustrated by FIG. 11. The benefit of this device is that if $s_3$ is located far from $s_0$ then load of the driver of $s_0$ is too large and delay of $s_0$ is large. If $s_3$ is located close to $s_2$ then if we turn $s_3$ into child of $s_2$ then load of $s_0$ becomes smaller and delay of $s_0$ becomes smaller. In this case, Moving Through Two Inverters is better than Insertion of Buffer.

10. Elimination of Two Inverters

This device selects a descendant $s_1$ of the specified vertex, where $s_1$ is an inverter, selects a descendant $s_2$ of $s_1$, where $s_2$ is the inverter, selects a child $S_3$ of $s_2$, and makes $s_3$ into the child of the initial vertex. The type of the specified vertex is changed in an optimal way. Some of the vertices (e.g. $s_2$) can be deleted, if their only children are deleted.

11. Removal of One Buffer

This device selects a child $s_1$ of the specified vertex, where $s_1$ is buffer, and makes all children of $s_1$ to be the children of initial vertex, then $s_1$ is deleted. The system determines that the buffer should be removed by removing the buffer and determining whether timing (ramptime) is improved thereby.

12. Removal of All Buffers

This device removes all children of the specified vertex, which are buffers. The children of the buffers deleted become the children of initial vertex. The system determines that the buffer should be removed by removing the buffer and determining whether timing (ramptime) is improved thereby.

13. Removal of Two Inverters

If the specified vertex is inverter and all its children are inverters, we delete all inverters including the specified vertex. The children of the inverters deleted become the children of either the parent of the specified vertex or of the new buffer that becomes the child of the parent of the initial vertex. In the latter case the type of the new buffer is selected to be optimal.

VI. SECTION 5

Local Resynthesis Of Logic Trees With Multiple Cost Functions

The purpose of this Local Resynthesis of Logic Trees with Multiple Cost Functions procedure is to create a fast and effective procedure for the complex timing, ramptime, and area optimization that uses an automatically generated identities base for the given technology basis (see Section 3 herein). Such a procedure can be easily moved from one technology basis to another.

The creation of an identities package targeted at timing optimization is essentially hardened because the estimation function for the parts of identities is determined mainly by the input timing distribution among the variable of these identifies, not by the identifies structure. The same difficulties emerge when we try to generate identities for ramptime optimization. On the other hand, there exists an effective automatic procedure that generates big packages of simplifying identities for total cell area optimization (see Section 3) (these packages can be viewed as "theories" of the given technology basis).

The general idea of applying these identities to timing or ramptime optimization is to look through a critical (in the corresponding sense) zone of the formula being optimized, and, with the help of the identities base, to create alternative representations of subformulas and to choose the best representation. Identities can be applied in both directions. If the goal is the local area optimization, identities can be only applied from left to right. Due to the fact that the local optimization procedures are applied in a definitive order (see Section 2 herein), their application is restricted by supplementary constraints—e.g. while optimizing the total area we prohibit the use of transformations that aggravate timing or ramptime values.

A. Detailed Procedure Description

Tree-like design blocks that lie in the critical part of the design (in case of local area optimization—all tree-like blocks) are selected as optimization windows. For every selected block D, we perform the following:

In case of area optimization:

We try to find an identity from the base that can be applied to the formula F and D from left to right (see description of Quick Search for Identities Applicable to Specified Formula set forth in Section 6). If we find such an identity, we apply it, if it does not aggravate the critical design parameters. If none of the identities is applicable, we get the result.

In case of timing or ramptime optimization:

a) We determine the critical (in a corresponding sense) zone K in D.

b) We look through every cell A of K. Every cell is a root of a tree brunch that implements some subformula F. We apply all possible technology basis operations identities to F (see description of Quick Search for Identities Applicable to Specified Formula described in Section 6) and form the set H of results. The identities can be applied in both directions. Those results of H where timing or ramptime are better that timing or ramptime of F are saved into the concentrator of alternative representations of A. We also look through the representations of A that have better ramptime but worse area.

c) After the process of alternative representations generation is over, we choose the best variant H for the actual replacement in the resynthesis window. The choice is based on the following priorities:

P1) If there exist alternative representations that reduce ramptime violation, we choose the one that gives the most significant reduction.

P2) If there exist alternative representations that preserve cells area (it is possible, because the identities were generated not only on the basis of strictly simplifying identities, but also on the basis f identities that preserve the area, including the ones that reflect the "symmetry" of the operations), we choose the representation that provides the most significant timing improvement.

P3) If all alternative representations increase the area, for every representation we evaluate the relation of timing decrement to area increment, and choose the representation With the greatest value of this relation.

After the best representation is chosen, we modify the resynthesis window and transit to the step d).

d) We perform a cycle of the simplest simplifying transformations of the resynthesis window implemented with the help of a small identities base subclass; the transformations that increase window timing or ramptime violations are banned. After that we transit to the step a). If there are no alternative representations that reduce the timing value, we end the procedure.

VII. SECTION 6

Quick Search For Identities Applicable To Specified Formula

The purpose of this invention is a quick search in the set of identities base for those that can be applied to a given formula.

This procedure is applied by Local Resynthesis of, Logic Trees with Multiple Cost Function described in Section 5 herein and Automatic Generation of Identities in Technology Library described in Section 3 herein.

Let us consider a formula f and an identity base B, i.e., a set of pairs of equivalent formulas in some basis. Very often there emerges a problem of finding the identities from B that can be applied to f. It leads to new formulas equivalent to f. The standard procedure that solves this problem is the following: we examine every formula p of identity from B one after another, and try to perform a procedure of unification of the terms p and f.

In order to achieve the goals of the invention all the formulas from the identity base B are transformed into the "standard" form. Based upon B, we build a specialized address structure. Given a formula f, we transform it to the "standard" form, and then with the help of the address structure, we obtain a small subset of identities-candidates, and try to perform the unification of these candidates and f.

A. Formula Representation

Let us introduce a function $\phi$ (referred as code) that takes a technology basis operation or a variable as its input and produces a natural number as its output. The code of different operations and different variables are different. The code of any operation is smaller than the code of any variable. Finally $\phi(x_1) < \phi(x_2) < \ldots$, i.e., the codes of variables increase for increasing indices.

Formulas are represented by trees. Every vertex of such tree is marked by the code of an operation or a variable (if the vertex is a hanging one). The children of nonhanging vertices are the arguments of the corresponding operation. The representation of the formula and2(or2($x_1$,$x_2$), not($x_3$)) is presented on FIG. 16. The linear formula representation can be easily restored from the tree representation with the help of depth-first tree pass algorithm.

B. Input Symmetry Tree

For every technology basis operation (cell) we build the input symmetry tree. Every vertex of this tree has two marks: a set of input variables (inputs), and a value from the set {C,N} (it indicates whether the cell is commutative or not).

The first mark of the tree root is the whole set of input variables of the cell. The first marks of brothers do not intersect. The union of the first marks of all children is equal to the first mark of their parent, i.e., the first marks of children are a partition of the first mark of their parent.

If a vertex is hanging (i.e., has no children), and the second mark is C, it means that every permutation of the input variables of the first mark does not affect the value of the function implemented by this cell.

If a vertex is hanging, and the second mark is N, it means that every permutation of the input variables of the first mark does affect the value of the function implemented by this cell.

If a vertex is internal, and the second mark is C, it means that the groups of variables corresponding to the children can be permuted, and the value of the function implemented by the cell will not be changed.

If a vertex is internal, and the second mark is N, it means that after the groups of variables corresponding to the children-are permuted, the value of the function implemented by the cell will be changed.

Input symmetry trees of and3($x_1,x_2,x_3$) and mux41($x_1,x_2,x_3,x_4,x_5,x_6$) can be found in FIG. 17.

C. Formula Transformation to Standard Form

Every formula represented by a tree can be transformed into the linear form by performing a depth-first tree pass. The result of the comparison of two formulas is determined by the lexicographical order of the words composed of the operation codes in the linear form.

A formula is called standard, if for every formula operation the arguments that can be permuted according to the input symmetry tree of this operation are ordered by code (in ascending order).

The standard form of the formula f can be defined in a more formal manner as a form of the formula after the application of the Formula Transformation Procedure to Standard Form.

To define this procedure let us first describe the Procedure of Ordering a Vertex of the Formula Tree.

1) If the vertex.under consideration is hanging, i.e., it is marked by a variable, it is considered to be ordered, and the procedure stops.
2) If the vertex α under consideration is marked by an operation code, and the symmetry tree of this operation contains only one vertex with the second mark N, then α is considered to be ordered, and the procedure stops.
3) If the vertex α under consideration is marked by an operation code, and the symmetry tree of this operation contains only one vertex with the second mark C, then α's children are ordered according to the lexicographical order of their linear forms. After that the vertex is considered to be ordered, and the procedure stops.
4) If the vertex α under consideration is marked by a operation code, and the symmetry tree of this operation consists of more than one vertex, we look through the symmetry tree from leaves to the root, and we order every vertex after its children are ordered.
   4.1) If a symmetry tree vertex is marked by N, then it is considered to be ordered.
   4.2) If a symmetry tree vertex is hanging and marked by C, the children of α corresponding to the arguments belonging to the set corresponding to the given symmetry tree vertex are ordered according to the lexicographical order of their linear forms.
   4.3) If a symmetry tree vertex is internal and marked by C, the formulas corresponding to the children of this vertex considered as words are ordered in lexicographical order.

After the root of the symmetry tree is ordered, α is considered to be ordered, and the procedure stops.

The Formula Transformation Procedure to Standard Form is the following.

We look through the formula tree from leaves to the root. After all the children of a vertex are ordered, we order the vertex itself. After the root is ordered, the formula is considered to be in the standard form.

D. Lexicographical Tree

Let A be an alphabet with ordered letters.

Let B be the set of words in A ordered in the lexicographically with respect to the order in A. The lexicographical tree of B is a oriented tree with a root that satisfies the following conditions:
  every vertex except the root is marked by a letter from A (the root is marked by an "empty" symbol);
  all edges are directed from the root to leafs;
  a code of a lexicographical tree vertex is a word composed of letters corresponding to the vertices of the chain leading from the root to the given vertex; for every word from B there exists a unique lexicographical tree vertex the code of which is equal to this word; this vertex is called a pole of this word;
  for every lexicographic tree vertex a branch with the root in this vertex contains all poles of words with a prefix equal to the code of this vertex;
  every vertex belongs to some chain that leads from the root to the pole of some word from B;
  for every vertex its children are ordered according to the order of letters they represent.

For example, the lexicographical tree of a set (be, bed, car, cat) is presented on FIG. 18. The poles are marked by bold dots.

E. Identity Base Address Structure Creation

The sequence of codes of operations, variables and closing brackets of the formula written in the order they occur in the linear form is called the formula code word. The code of a closing bracket is any number different from the codes of operations and variables.

For example, φ(and2) φ(or2) φ(')') φ(not) φ(')') φ(')') is the code word of the formula and2(or2($x_1,x_2$), not($x_3$)).

Let us consider an identity base B. All the formulas are considered to be in the standard form and enumerated by numbers starting with 1. We create the set of code words of B in the following way. We look through all the identities. If an identity is supposed to be applied only from left into right, we add the code word of the left part of the identity. If an identity is supposed to be applied in both directions, we add the code words of the both parts.

After that we build the lexicographical tree of the code word set of B. For every code word we select its pole and attach the list of formula numbers of the formulas with the given code word. The resulting construction is called the identity base address structure.

F. Identity Selection Procedure

The input of this procedure is a formula in the standard form; the output is the list of formula numbers from the identity base.

The procedure uses a supplementary set of vertex pairs. The first vertex of a pair belongs to the formula tree, the second vertex belongs to the identity base address structure. At the beginning this set is empty.

At the beginning the root of the address structure is the current vertex and the root of the formula tree is the current vertex $\alpha$.

1) If $\alpha$ is a variable, then we go to the step 2, else evaluate the code f of the function that marks $\alpha$. Then look through the children of B and try to find a child with the code f. If such a child does not exist, then we go to the step 2. Else if $\alpha$ is not the formula tree root, we add ($\alpha,\beta$) to the supplementary set. If f is a code of a constant, we go to the step 2, else the obtained child becomes $\beta$, and the first child of $\alpha$ becomes $\alpha$. Then we go to the step 1.

2) If the current vertex $\alpha$ has a brother on the right (i.e., $\alpha$ is not the youngest child), then this brother becomes $\beta$; and we go to the step 1, else we go to the step 3.

3) We look through the children of $\beta$ and try to find the one marked by a closing bracket. If such a child does not exist, we go to step 4, else this child becomes $\beta$. If the parent of $\alpha$ is not the formula tree root, the father of $\alpha$ becomes $\alpha$, and we go to the step 3. If the parent of $\alpha$ is a root, $\beta$ is the pole of some code word, and numbers from the list corresponding to $\beta$ are added to the answer.

4) If the supplementary set is empty, then we exit from the procedure, else we move the last pair away from the supplementary set. The first vertex of this pair becomes $\alpha$, the second vertex becomes $\beta$, and we go to the step 3.

It can be easily seen that the answer of the identity selection procedure contains all identities applicable to the initial formula. The identities applicable to this formula can be obtained with the help of the Unification, Substitutions Search Procedure For Formulas in Technology Library from the formulas composing the Identity Selection Procedure's answer.

VIII. SECTION 7

Optimal Critical Netlist Area Selection

The purpose of the Optimal Critical Netlist Area Selection procedure is to select optimal, relatively small critical part of the chip as a separate object for the resynthesis.

This procedure is applied in Timing Driven Resynthesis described in Section 2 herein, where it is used for the preparation of local tasks for Local Resynthesis of Logic Trees With Multiple Cost Functions described in Section 5 herein and DynamicBuffer and Inverter Tree Optimization described in Section 4 herein.

Timing Driven Resynthesis described herein in Section 2 changes the chip step by step, making the improvements of the chip locally. The main idea of the local resynthesis is to consecutively examine the cell trees of the chip for the necessity of the optimization, and then to organize the chosen trees as local tasks for the following resynthesis. We make the task collecting all necessary information about the tree neighborhood (neighboring cells, capacities, delays, etc.) Local optimization procedures work with this information only. We need not an additional information about the chip structure. The use of small date amount makes it possible to speed up the procedure of the tree optimization. Moreover, we can consider few tasks in a parallel way. It also makes the process of chip resynthesis faster.

A. Logic Trees and Trees of Buffers

In all what follows a set of all cell pins connected to a wire together with this wire is called a net.

Within the logic resynthesis we consider the so called ordinary logic cells, i.e., the cells with one output pin constructed using the standard logic gates NOT, AND, OR. A logic tree is a tree formed from ordinary logic cells. The output pin of each cell of the tree except for one is connected with one input pin exactly, and this input pin is a pin of a cell of the considered tree. The exceptional cell of the tree is called the root of this tree. The output pin of the root can be connected with any number of input cell pins. All cells connected with the output pin of the root do not belong to our tree, and they are not necessarily logic. An input pin of a cell of the tree can be connected with the power or with the ground. Finally, some input pins of tree cells are connected with cells outside the tree. These input pins are called the entrances of the tree.

An example of a logic tree is given on FIG. 12. The tree on the figure contains 6 cells drawn inside the dotted rectangle.

We enumerate all entrances of the tree assigning variables $x_n$ to the entrances. In addition we assign equal variables to entrances connected with a wire because the input values of these entrances are always the same. In the example on FIG. 12 the variable $x_1$ is assigned to the first input pin of the cell ND3C and to the first input pin of the cell ENB, the variable $x_2$ is assigned to the second input pin of the cell ENB and to the first input pin of the cell NR2A, the variable $x_3$ is assigned to the input pin of the cell N1C.

It is possible to present a logic tree as a logic expression in the technology basis. For instance the tree drawn on FIG. 12 can be presented as the following logic expression $AND2B(ND3C(x_1,1,ENB\ (x_1,x_2)), N1A(NR2A(x_2,N1C(x_2, N1C(x_3))))$.

The goal of the logic resynthesis is to modify a logic expression to a logically equivalent one, which is better with respect to the given estimator.

The cells considered in the buffer optimization procedure are buffers and inverters, i.e., regular logic cells with one input pin. A buffer tree construction is based on a set of nets. All these nets except for one (called the root of the tree) are satisfied the following conditions.

1) A net contains exactly one output cell pin.
2) This output pin is a pin of a buffer or of an inverter.
3) The net containing the input pin of this buffer or inverter also belongs to the net set of the tree.

We say that a buffer or an inverter is a cell of the buffer tree if the nets connected both with input and output pins of this cell are in the net set of the tree. An input pin of a net of the chosen set is called the exit of the tree if it is not a pin of a buffer or an inverter of the tree. We enumerate all exists of the buffer tree by different variables $x_n$.

A simplest example of a buffer tree does not contain buffers or inverters. A net set consists of only one arbitrary net. All input pins of this net are exists of the tree.

Another example of a buffer tree is presented on FIG. 13. This buffer tree consists of 3 buffers and 5 inverters, the net set contains 9 nets. There are 8 exits in the tree.

Each buffer tree can be written in the form of a "reverse" buffer expression which describes the connection between buffers and inverters of the tree and exits of the tree. For instance, the buffer tree given on FIG. 13 can be written in the form $\{N1A(BUFC(N1B(x_1), N1C(x_2),x_3)),x_4, BUFB(BUFA(x_5), N1C(x_6, x_7)), N1F(x_8)\}$.

The goal of buffer organization is to transform the buffer expression to a better equivalent expression.

B. Choice of Trees

There are three goals of the chip optimization. We choose trees for local optimization in accordance with the optimization goal.

The simplest optimization goal is to decrease the total cell area. All buffer trees containing at least one buffer or inverter and all logic trees are under consideration in this case.

The second goal of optimization is to eliminate all ramp-time violations of the nets.

For any edge ($P_{in}$, $P_{out}$) of a cell the transition delay of this edge should be not greater than the given value MaxRamptime.

$$\text{transition}(P\text{in}, P\text{out}) \geq \text{MaxRamptime}. \quad (1)$$

The transition delay is a function on the capacity of the net w connected to the output pin $P_{out}$. Thus for any output, pin $P_{out}$ we can find the maximal possible capacity MaxCap($P_{out}$) of the net w guaranteeing the validity of the-equation (1). If the capacity Cap(w) of the net w exceeds MaxCap($P_{out}$) then we say that there is a ramptime violation on the net w.

Solving the problem of the elimination of ramptime violations we look over all the trees containing nets with ramptime violations or neighboring to these nets.

The more important goal of resynthesis is the timing optimization. We assume that the description of the chip contains the descriptions of one or few so called intervals. An interval description consists of the following data.

1) A starting list of cell pins. All paths of the interval are starting from-these pins. Additionally we have a start time for each starting pin. This time should be added to the delay of any path starting from the corresponding pin.

2) An ending list of cell pins. All paths of the interval are ending on these pins. Additionally we have an end time for each ending pin. This time should be added to the delay of any path ending on the corresponding pin.

3) A required time ReqTime(T) of the interval T. The delays of all interval paths (i.e., paths from the starting pins to the ending pins) should be not greater than the required time.

We can also take into account false pins or constant nets. All paths through false pins and constant nets must be ignored.

Denote by MaxReq the maximal required time of the intervals.

For any cell pin P and any interval T we define the arrival time InTime(P, T) as a maximal delay of paths from starting pins of the interval T to the pin P, and the output time Outtime(P, T) as a maximal delay of paths from the pin P to ending pins of the interval T. If there are no paths from the starting pins to P or from P to the ending pins then we set InTime(P, T)=$-\infty$ or Outtime(P, T)=$-\infty$ respectively. For all cell pins P and all intervals T we denote by $$\text{MaxDelay}(P,T)=\text{InTime}(P,T)+\text{Outtime}(P,T)$$

the maximal delay of paths of interval T through the pin P. The value $$\text{TimeViol}(P)=\max_T\{\text{MaxDelay}(P,T)-\text{ReqTime}(T)\}$$

is called the violation on the pin P. We can define the maximal violation of the chip $$\text{MaxViol}=\max_P\{\text{TimeViol}(P)\}.$$

For the timing optimization we consider all trees which contain pins with timing violations greater than MaxViol-$\epsilon$. The typical value of $\epsilon$ is 0.0001

C. Algorithm of Task Preparation

After the choice of a tree (logic tree or buffer tree) we prepare the task of local optimization of this tree selecting an approximate information about the tree neighborhood. In spite of the approximation a solution of a local optimization task usually improves the chip. In a very rare case when a task solution makes the chip worse we can undo the chip modification.

We describe now the information about the tree neighborhood that should be kept in memory for the local task solving.

First of all, we need the description of the tree cells (cell types, coordinates, flips and angles of the cells).

Then we should describe the input nets of the tree. For any input net of logic tree there is a variable assigned to this net. In the case of a-buffer tree only the root of the tree is an input net. Any input net w of the tree contains an output cell pin (driving pin) $P_{out}$ that is not in the tree. For any interval T the arrival time InTime($P_{out}$, T) of this pin depends on the capacity of the net w. This capacity will be changed after the tree modification. So it is necessary to keep in memory the arrival time of the pin as a function on the capacity. Usually this function is a piecewise linear function. Note that the function can be identically equal to $-\infty$. If there are several driving pins in the net then we consider the maximum of the corresponding functions. Really, it is not necessary to keep the arrival times for all intervals. We will work only with their maximum $$\text{In}(w)=\max_T\{\text{InTime}(P_{out},T)\}.$$

For any driving pin $P_{out}$ of an input net we select also the coordinates of the pin and the maximum possible capacity MaxCap($P_{out}$) preserving the net from the ramp-time violation.

In the case of logic tree the input net w can contain input pins of cells that do not belong to our tree. For all these pins we memorize the coordinates and the capacities of the pins. Let WireDelay($P_{out}$, $P_{in}$) be the delay of the wire between the output pin $P_{out}$ and an input pin $P_{in}$. For any interval T the following condition have to be fulfilled.

$$\text{InTime}(P_{out},T)+\text{OutTime}(P_{in},T)+\text{WireDelay}(P_{out}, P_{in}) \geq \text{ReqTime}(T). \quad (2)$$

Only the first summand in the left part of this inequality depends on the capacity of the net w. So we can define the maximal capacity c(w) of the net such that (2) is valid, and store the maximum $c_O$(w)=max{c(w), Cap(w)} of the values c and Cap(w). The capacity of the net w must be not greater than $c_O$(w) after the tree optimization.

It is certain that we need also the information on the output nets of the tree. For a buffer tree we consider all exits of the tree, and for each exit $P_{in}$ corresponding to a variable $x_n$ we select the coordinates and the capacity of the pin and the output time.

$$\text{Out}(P_{in})=\max_T\{\text{OutTime}(P_{in},T)+\text{MaxReq}-\text{ReqTime}(T)\}.$$

Now using the collected information we can define the delay of the variable $x_n$ as a sum $$\text{Delay}(x_n)=\text{In}(w)+\text{TreeDelay}(P_{in})+\text{Out}(P_{in}),$$

where $P_{out}$ is the driving pin of the tree root, and TreeDelay($P_{in}$) is the delay of the tree from the driving pin to the exit $P_{in}$.

For any input pin $P_{in}$ connected by the wire with the root of the logic tree we store the coordinates and the capacity of the pin and the output time Out($P_{in}$) defined by the formula $$Out(P_{in})=\max T\{OutTime(P_{in},T)+MaxReq-ReqTime+WireDelay(R, P_{in})\},$$

where WireDelay(R, $P_{in}$) is the wire delay between the output root pin R and the pin $P_{in}$. The maximum of the output times Out($P_{in}$) is denoted by OutRoot. For any input net w of the tree there is a variable $x_n$ assigned to this net. For each entrance P belonging to the net w we define the delay through this entrance as follows $$Delay(P)=In(w)+WireDelay(P_{out},P)+TreeDelay(P)+OutRoot.$$

The delay Delay($x_n$) of the variable $x_n$ is equal to the maximum of the delays Delay(P), where P runs all entrances of the tree such that the variable $x_n$ is assigned to P.

We have not took into account the goal of the resynthesis yet. Now we introduce two goal values MaxGoalTime and MinGoalTime. In the case of area optimization or ramptime optimization we set $$MaxGoalTime=MinGoalTime=MaxViol,$$

and in the case of timing optimization we set $$MinGoalTime=MaxViol-2\epsilon, MaxGoalTime=MaxViol-\epsilon.$$

Then we form a special goal array Goal that is used for the timing control in the tree.

The length of the array is equal to the number of variables. For any variable $x_n$ the corresponding entry Goal[n] of the array is equal to $$Delay(x_n)-MinGoalTime$$

if Delay($x_n$)≦MinGoalTime, is equal to $$Delay(x_n)-MaxGoaltime$$

if Delay($x_n$)≧MaxGoaltime, and is equal to 0 otherwise. The optimization procedure can not increase the delay Delay($x_n$) if the value Goal[n] is not negative, the aim of the optimization is to decrease Delay($x_n$) by Goal[n] in this case. If the value Goal[n] is negative then we may increase Delay($x_n$) by −Goal[n].

IX. SECTION 8

Operating Environment

FIG. 14 is an illustration of a general purpose computer system, representing one of many suitable computer platforms for implementing the inventive IC design optimization methods described above. FIG. 14 shows a general purpose computer system 950 in accordance with the present invention includes a central processing unit (CPU) 952, read only memory (ROM) 954, random access memory (RAM) 956, expansion RAM 958, input/output (I/O) circuitry 960, display assembly 962, input device 964, and expansion bus 966. Computer system 950 may also optionally include a mass storage unit 968 such as a disk drive unit or nonvolatile memory such as flash memory and a real-time clock 970.

CPU 952 is coupled to ROM 954 by a databus 972, control bus 974, and address bus 976. ROM 954 contains the basic operating system for the computer system 950. CPU 952 is also connected to RAM 956 by busses 972, 974, and 976. Expansion RAM 958 is optionally coupled to RAM 956 for use by CPU 952. CPU 952 is also coupled to the I/O circuitry 960 by data bus 972, control bus 974, and address bus 976 to permit data transfers with peripheral devices.

I/O circuitry 960 typically includes a number of latches, registers and direct memory access (DMA) controllers. The purpose of I/O circuitry 960 is to provide an interface between CPU 952 and such peripheral devices as display assembly 962, input device 964, and mass storage 968.

Display assembly 962 of computer system 950 is an output device coupled to I/O circuitry 960 by a data bus 978. Display assembly 962 receives data from I/O circuitry 960 via bus 978 and displays that data on a suitable screen.

The screen for display assembly 962 can be a device that uses a cathode-ray tube (CRT), liquid crystal display (LCD), or the like, of the types commercially available from a variety of manufacturers. Input device 964 can be a keyboard, a mouse, a stylus working in cooperation with a position-sensing display, or the like. The aforementioned input devices are available from a variety of vendors and are well known in the art.

Some type of mass storage 968 is generally considered desirable. However, mass storage 968 can be eliminated by providing a sufficient mount of RAM 956 and expansion RAM 958 to store user application programs and data. In that case, RAMs 956 and 958 can optionally be provided with a backup battery to prevent the loss of data even when computer system 950 is turned off. However, it is generally desirable to have some type of long term mass storage 968 such as a commercially available hard disk drive, nonvolatile memory such as flash memory, battery backed RAM, PC-data cards, or the like.

A removable storage read/write device 969 may be coupled to I/O circuitry 960 to read from and to write to a removable storage media 971. Removable storage media 971 may represent, for example, a magnetic disk, a magnetic tape, an opto-magnetic disk, an optical disk, or the like. Instructions for implementing the inventive method may be provided, in one embodiment, to a network via such a removable storage media.

In operation, information is inputted into the computer system 950 by typing on a keyboard, manipulating a mouse or trackball, or "writing" on a tablet or on position-sensing screen of display assembly 962. CPU 952 then processes the data under control of an operating'system and an application program stored in ROM 954 and/or RAM 956. CPU 952 then typically produces data which is outputted to the display assembly 962 to produce appropriate images on its screen.

Expansion bus 966 is coupled to data bus 972, control bus 974, and address bus 976. Expansion bus 966 provides extra ports to couple devices such as network interface circuits, modems, display switches, microphones, speakers, etc. to CPU 952. Network communication is accomplished through the network interface circuit and an appropriate network.

Suitable computers for use in implementing the present invention may be obtained from various vendors. Various computers, however, may be used depending upon the size and complexity of the optimization tasks. Suitable computers include mainframe computers, multiprocessor computers, workstations, or personal computers.

It should be understood that the present invention also relates to machine readable media on which are stored program instructions for performing methods of this invention. Such media includes, by way of example, magnetic disks, magnetic tape, optically readable media such as CD ROMs, DVD, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method for optimizing an integrated circuit chip, said method comprising the following steps:
   a. analyzing the chip and selecting regions for local optimization;
   b. selecting a first method of local optimization;
   c. applying said first method of local optimization to each selected region;
   d. selecting a second method of local optimization;
   e. applying said second method of local optimization to less than all the selected regions.

2. The method of claim 1 wherein said first method of local optimization is faster than said second method of local optimization.

3. A system for optimizing an integrated circuit chip, said system comprising:
   a. means for analyzing the chip and selecting regions for local optimization;
   b. means for selecting a first method of local optimization;
   c. means for applying said first method of local optimization to each selected region;
   d. means for selecting a second method of local optimization; and
   e. means for applying said second method of local optimization to less than all the selected regions.

4. The system of claim 3 wherein said first method of local optimization is faster than said second method of local optimization.

* * * * *